United States Patent
Artwohl et al.

(10) Patent No.: US 10,838,453 B2
(45) Date of Patent: Nov. 17, 2020

(54) DOOR FOR MOUNTING A REMOVABLE ELECTRONIC DISPLAY

(71) Applicant: Anthony, Inc., Sylmar, CA (US)

(72) Inventors: Paul J. Artwohl, Stevensville, MI (US); Jeffery W. Nicholson, Palmdale, CA (US)

(73) Assignee: Anthony, Inc., Sylmar, CA (US)

( * ) Notice: Subject to any disclaimer, the term of this patent is extended or adjusted under 35 U.S.C. 154(b) by 0 days.

(21) Appl. No.: 16/712,192

(22) Filed: Dec. 12, 2019

(65) Prior Publication Data

US 2020/0310487 A1    Oct. 1, 2020

Related U.S. Application Data

(63) Continuation of application No. 16/369,054, filed on Mar. 29, 2019, now Pat. No. 10,514,722.

(51) Int. Cl.
  *G06F 1/3234* (2019.01)
  *G06F 1/16* (2006.01)
  *H05K 5/00* (2006.01)

(52) U.S. Cl.
  CPC .......... *G06F 1/1601* (2013.01); *G06F 1/3265* (2013.01); *H05K 5/0017* (2013.01)

(58) Field of Classification Search
  None
  See application file for complete search history.

(56) References Cited

U.S. PATENT DOCUMENTS

| | | | |
|---|---|---|---|
| 2,002,322 A | 5/1935 | Kraemer | |
| 4,371,870 A | 2/1983 | Biferno | |
| 4,671,582 A | 6/1987 | Stromquist et al. | |
| 4,893,902 A | 1/1990 | Baughman et al. | |
| 4,998,382 A | 3/1991 | Kostos et al. | |
| 5,024,023 A | 6/1991 | Kostos et al. | |
| 5,111,618 A | 5/1992 | Kaspar et al. | |

(Continued)

FOREIGN PATENT DOCUMENTS

| CN | 105627676 | 6/2016 |
|---|---|---|
| DE | 10205405 | 8/2003 |

(Continued)

OTHER PUBLICATIONS

Extended European Search Report for European Patent Application No. 12782035, dated Jun. 9, 2015, 7 pages.

(Continued)

*Primary Examiner* — Xanthia C Cunningham

(74) *Attorney, Agent, or Firm* — Fish & Richardson P.C.

(57) ABSTRACT

In one general aspect, the subject matter described in this specification can be embodied in a display case door that includes an insulated panel assembly, a door frame, and an electronic display mounted to the door. The door frame extends about and is secured to a peripheral edge of the insulated panel assembly. The electronic display overlays the insulated panel assembly. A mounting bezel is secured to the door frame and has a coupling end that extends over an edge of the electronic display securing the electronic display to the door frame. A cover bezel is coupled to a front surface of the door frame, where the cover bezel is sized to overlay the front surface of the door frame and the coupling end of the mounting bezel.

20 Claims, 23 Drawing Sheets

(56) References Cited

U.S. PATENT DOCUMENTS

| | | | |
|---|---|---|---|
| 5,116,274 A | 5/1992 | Artwohl et al. |
| 5,174,056 A | 12/1992 | King |
| 5,255,473 A | 10/1993 | Kaspar et al. |
| 5,270,843 A | 12/1993 | Wang |
| 5,645,330 A | 7/1997 | Artwohl et al. |
| 6,005,652 A | 12/1999 | Matsuhira |
| 6,148,563 A | 11/2000 | Roche et al. |
| 6,377,228 B1 | 4/2002 | Jenkin et al. |
| 6,427,772 B1 | 8/2002 | Oden et al. |
| 6,475,087 B1 | 11/2002 | Cole |
| 6,476,885 B1 | 11/2002 | Murray et al. |
| 6,606,832 B2 | 8/2003 | Richardson et al. |
| 6,606,833 B2 | 8/2003 | Richardson et al. |
| 6,874,903 B2 | 4/2005 | Yang et al. |
| 7,072,096 B2 | 7/2006 | Holman et al. |
| 7,121,675 B2 | 10/2006 | Ter-Hovhannisian |
| 7,319,407 B2 | 1/2008 | Jang et al. |
| 7,413,233 B1 | 8/2008 | Jung |
| 7,513,637 B2 | 4/2009 | Kelly et al. |
| 7,618,295 B2 | 11/2009 | McCoy |
| 7,625,246 B2 | 12/2009 | McCoy et al. |
| 7,651,368 B2 | 1/2010 | Kendall et al. |
| 7,686,127 B2 | 3/2010 | LeClear et al. |
| 7,713,090 B2 | 5/2010 | Kendall et al. |
| 7,765,332 B2 | 7/2010 | McCoy et al. |
| 7,798,865 B2 | 9/2010 | McCoy et al. |
| 7,810,343 B2 | 10/2010 | McCoy et al. |
| 7,824,056 B2 | 11/2010 | Madireddi et al. |
| 7,826,203 B2 | 11/2010 | McCoy |
| 7,843,697 B2 | 11/2010 | McCoy et al. |
| 7,865,639 B2 | 1/2011 | McCoy et al. |
| 7,870,686 B2 | 1/2011 | Hines |
| 7,870,753 B2 | 1/2011 | Marcy et al. |
| 7,871,300 B2 | 1/2011 | McCoy et al. |
| 7,889,482 B2 | 2/2011 | Lee |
| 7,934,384 B2 | 5/2011 | Tuskiewicz et al. |
| 7,980,088 B2 | 7/2011 | LeClear et al. |
| 8,018,716 B2 | 9/2011 | McCoy |
| 8,031,289 B2 | 10/2011 | Naritomi |
| 8,040,666 B2 | 10/2011 | McCoy et al. |
| 8,472,174 B2 | 6/2013 | Idems et al. |
| 8,578,081 B1 | 11/2013 | Fils |
| 8,683,745 B2 | 4/2014 | Artwohl et al. |
| 8,756,865 B2 | 6/2014 | Nicholson et al. |
| 9,052,536 B2 | 6/2015 | Artwohl et al. |
| 9,155,405 B2 | 10/2015 | Artwohl et al. |
| 9,500,896 B2 | 11/2016 | Dunn et al. |
| 9,504,338 B2 | 11/2016 | Artwohl et al. |
| 9,514,661 B2 | 12/2016 | Riegel |
| 9,632,358 B2 | 4/2017 | Kim et al. |
| 9,633,366 B2 | 4/2017 | Dunn |
| 9,687,087 B1 | 6/2017 | Artwohl et al. |
| 9,781,847 B2 | 10/2017 | Sun et al. |
| 9,823,690 B2 | 11/2017 | Bowers et al. |
| 10,185,168 B2 | 1/2019 | Kim |
| 10,194,564 B2 | 1/2019 | Dunn et al. |
| 10,212,845 B2 | 2/2019 | Dunn et al. |
| 10,222,837 B1 | 3/2019 | Budinich et al. |
| 10,514,722 B1 | 12/2019 | Artwohl et al. |
| 10,580,333 B2 | 3/2020 | Artwohl et al. |
| 2001/0010516 A1 | 8/2001 | Roh et al. |
| 2001/0052741 A1 | 12/2001 | Yun |
| 2002/0000322 A1 | 1/2002 | Bartlett et al. |
| 2002/0007486 A1 | 1/2002 | Yun |
| 2003/0038912 A1 | 2/2003 | Broer et al. |
| 2003/0117790 A1 | 6/2003 | Lee et al. |
| 2003/0205059 A1 | 11/2003 | Roche et al. |
| 2003/0207090 A1 | 11/2003 | Arora |
| 2003/0214619 A1 | 11/2003 | Masuda et al. |
| 2004/0073334 A1 | 4/2004 | Terranova |
| 2004/0093379 A1 | 5/2004 | Roh et al. |
| 2004/0144328 A1 | 7/2004 | Bonner et al. |
| 2004/0160388 A1 | 8/2004 | O'Keeffe |
| 2004/0194388 A1 | 10/2004 | Roche et al. |
| 2005/0068629 A1 | 3/2005 | Fernando et al. |
| 2005/0105303 A1 | 5/2005 | Emde |
| 2005/0172654 A1 | 8/2005 | Rohrer et al. |
| 2005/0202178 A1 | 9/2005 | Roche et al. |
| 2005/0265019 A1 | 12/2005 | Sommers et al. |
| 2006/0077636 A1 | 4/2006 | Kim |
| 2006/0103269 A1 | 5/2006 | Artwohl et al. |
| 2006/0127586 A1 | 6/2006 | Roche et al. |
| 2006/0145576 A1 | 7/2006 | Lee et al. |
| 2006/0158579 A1 | 7/2006 | Hasegawa |
| 2006/0192767 A1 | 8/2006 | Murakami |
| 2006/0203143 A1 | 9/2006 | Shin |
| 2006/0218828 A1 | 10/2006 | Schrimpf et al. |
| 2007/0003700 A1 | 1/2007 | Roche et al. |
| 2007/0016478 A1 | 1/2007 | Hill |
| 2007/0024822 A1 | 2/2007 | Cortenraad et al. |
| 2007/0058114 A1 | 3/2007 | Niiyama et al. |
| 2007/0076431 A1 | 4/2007 | Atarashi et al. |
| 2007/0133192 A1 | 6/2007 | Alessandro |
| 2007/0151274 A1 | 7/2007 | Roche et al. |
| 2007/0171647 A1 | 7/2007 | Artwohl et al. |
| 2007/0193280 A1 | 8/2007 | Tuskiewicz et al. |
| 2007/0195535 A1 | 8/2007 | Artwohl et al. |
| 2007/0216657 A1 | 9/2007 | Konicek |
| 2008/0004950 A1 | 1/2008 | Huang et al. |
| 2008/0024047 A1 | 1/2008 | Juo et al. |
| 2008/0158858 A1 | 7/2008 | Madireddi et al. |
| 2008/0165526 A1 | 7/2008 | Sarajii et al. |
| 2009/0002990 A1 | 1/2009 | Becker et al. |
| 2009/0036208 A1 | 2/2009 | Pennington et al. |
| 2009/0052206 A1 | 2/2009 | Matsui et al. |
| 2009/0121970 A1 | 5/2009 | Ozbek |
| 2009/0127425 A1 | 5/2009 | Frazer et al. |
| 2009/0128729 A1 | 5/2009 | Dunn |
| 2009/0146945 A1 | 6/2009 | Cho |
| 2009/0184893 A1 | 7/2009 | Yang |
| 2009/0225240 A1 | 9/2009 | Suzuki et al. |
| 2009/0244884 A1* | 10/2009 | Trulaske, Sr. ............ F21S 4/20 362/94 |
| 2009/0276319 A1 | 11/2009 | Lungu et al. |
| 2009/0295731 A1 | 12/2009 | Kim et al. |
| 2010/0013925 A1 | 1/2010 | Fowler et al. |
| 2010/0026912 A1 | 2/2010 | Ho |
| 2010/0043293 A1 | 2/2010 | Nicholson et al. |
| 2010/0062152 A1 | 3/2010 | Roche et al. |
| 2010/0068398 A1 | 3/2010 | Roche et al. |
| 2010/0083672 A1 | 4/2010 | Yoon et al. |
| 2010/0119705 A1 | 5/2010 | Roche et al. |
| 2010/0152892 A1 | 6/2010 | Gavra et al. |
| 2010/0214786 A1 | 8/2010 | Nichol |
| 2010/0220249 A1 | 9/2010 | Nakamichi et al. |
| 2010/0226091 A1 | 9/2010 | Dunn |
| 2010/0275477 A1 | 11/2010 | Kim |
| 2010/0293827 A1 | 11/2010 | Suss et al. |
| 2011/0019348 A1 | 1/2011 | Kludt et al. |
| 2011/0051071 A1 | 3/2011 | Nakamichi et al. |
| 2011/0083460 A1 | 4/2011 | Thomas et al. |
| 2011/0098849 A1 | 4/2011 | Hudis et al. |
| 2011/0116231 A1 | 5/2011 | Dunn et al. |
| 2011/0150276 A1 | 6/2011 | Eckhoff et al. |
| 2011/0181792 A1 | 7/2011 | Hammonds |
| 2011/0255024 A1 | 10/2011 | Chung et al. |
| 2012/0097671 A1 | 4/2012 | Gu et al. |
| 2012/0105424 A1 | 5/2012 | Lee et al. |
| 2012/0285089 A1* | 11/2012 | Artwohl ................... A47F 11/06 49/70 |
| 2012/0286638 A1 | 11/2012 | Lee et al. |
| 2013/0063326 A1 | 3/2013 | Riegel |
| 2013/0265525 A1 | 10/2013 | Dunn et al. |
| 2013/0271696 A1 | 10/2013 | Dunn |
| 2013/0314852 A1 | 11/2013 | Kincaid et al. |
| 2013/0329363 A1 | 12/2013 | Dunn et al. |
| 2014/0078407 A1 | 3/2014 | Green et al. |
| 2014/0144083 A1 | 5/2014 | Artwohl et al. |
| 2014/0208626 A1 | 7/2014 | Moon |
| 2014/0232958 A1 | 8/2014 | Venturas et al. |
| 2015/0015133 A1* | 1/2015 | Carbajal ................... A47F 3/04 312/405 |
| 2015/0223619 A1* | 8/2015 | Artwohl ................... E06B 3/025 428/69 |

(56) References Cited

U.S. PATENT DOCUMENTS

| | | |
|---|---|---|
| 2015/0335174 A1 | 11/2015 | Artwohl et al. |
| 2015/0338715 A1 | 11/2015 | Schaefer et al. |
| 2015/0362667 A1 | 12/2015 | Dunn |
| 2015/0362768 A1 | 12/2015 | Dunn |
| 2015/0366083 A1 | 12/2015 | Dunn et al. |
| 2015/0379905 A1 | 12/2015 | Kawasaki-Hedges et al. |
| 2016/0047592 A1* | 2/2016 | Rolek .................. F25D 23/063 312/406.1 |
| 2016/0054601 A1 | 2/2016 | Kitamura et al. |
| 2016/0054615 A1 | 2/2016 | Kim et al. |
| 2016/0061514 A1 | 3/2016 | Seo et al. |
| 2016/0095450 A1 | 4/2016 | Trulaske, Sr. |
| 2016/0174734 A1 | 6/2016 | Artwohl et al. |
| 2016/0220039 A1* | 8/2016 | Chang ..................... F21V 14/08 |
| 2016/0259366 A1 | 9/2016 | Kenney et al. |
| 2017/0068044 A1 | 3/2017 | Dunn |
| 2017/0083043 A1* | 3/2017 | Bowers ................. G06F 1/1601 |
| 2017/0089632 A1 | 3/2017 | Kang et al. |
| 2017/0257956 A1* | 9/2017 | An ........................ G09F 23/065 |
| 2017/0311736 A1 | 11/2017 | Zheng et al. |
| 2018/0124930 A1 | 5/2018 | Sisson |
| 2018/0146797 A1 | 5/2018 | Artwohl et al. |
| 2018/0146798 A1 | 5/2018 | Artwohl et al. |
| 2019/0059613 A1 | 2/2019 | Artwohl et al. |
| 2019/0221144 A1 | 7/2019 | Artwohl et al. |

FOREIGN PATENT DOCUMENTS

| | | |
|---|---|---|
| DE | 102009003127 | 11/2010 |
| EP | 2194222 | 6/2010 |
| EP | 3053487 | 8/2016 |
| JP | 2003-125904 | 5/2003 |
| WO | WO 1998/038547 | 9/1998 |
| WO | WO 2014/175639 | 10/2014 |

OTHER PUBLICATIONS

PCT International Preliminary Report on Patentability Ch. II in International Appln No. PCT/US2019/014001, dated Jan. 24, 2020, 8 pages.

PCT International Search Report in International Application No. PCT/US2019/014001, dated Apr. 5, 2019, 14 pages.

U.S. Notice of Allowance on U.S. Appl. No. 14/170,378 (F&L 107939-0147) dated Mar. 31, 2015, 10 pages.

USPTO Office Action in U.S. Appl. No. 16/250,096, dated Aug. 14, 2019, 22 pages.

\* cited by examiner

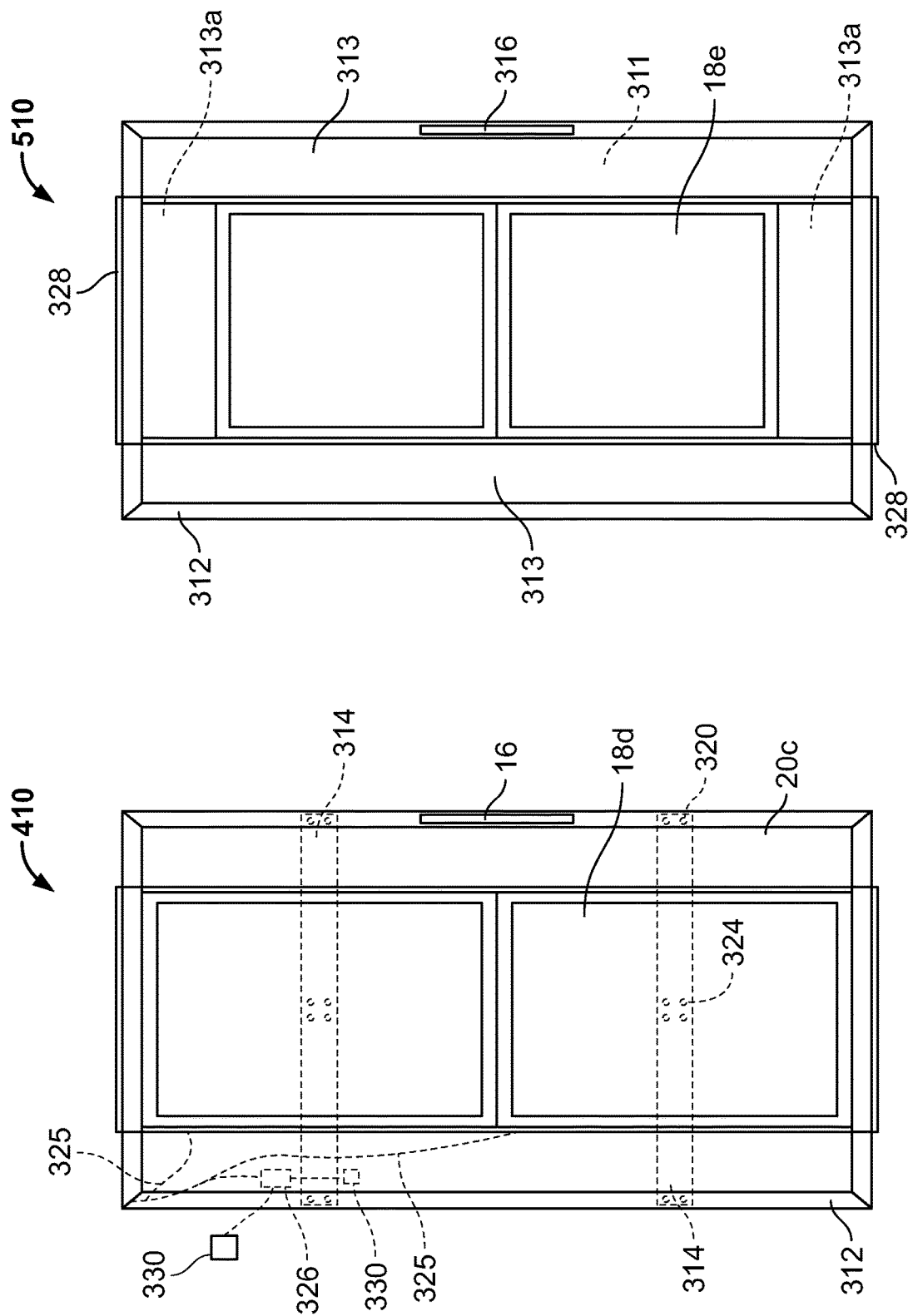

DOOR FOR MOUNTING A REMOVABLE ELECTRONIC DISPLAY

CROSS-REFERENCE TO RELATED APPLICATION

This application is a continuation application of and claims priority to U.S. application Ser. No. 16/369,054, filed on Mar. 29, 2019, the entire contents of which is incorporated by reference herein.

TECHNICAL FIELD

This invention relates to thermally insulated doors for temperature-controlled enclosures.

BACKGROUND

Refrigerated enclosures are used in commercial, institutional, and residential applications for storing and/or displaying refrigerated or frozen objects. Refrigerated enclosures may be maintained at temperatures above freezing (e.g., a refrigerator) or at temperatures below freezing (e.g., a freezer). Refrigerated enclosures have one or more thermally insulated doors or windows for viewing and accessing refrigerated or frozen objects within a temperature-controlled space. Doors for refrigerated enclosures generally include thermally insulated glass panel assemblies.

Displaying content on refrigerated display case doors can be an effective way of advertising products. Refrigerated display case doors with embedded display panels can be costly and difficult to maintain. Improvement in the methods for displaying content in refrigerated display case doors are continuously sought.

SUMMARY

In one general aspect, the subject matter described in this specification can be embodied in a display case door that includes an insulated panel assembly, a door frame, and, an electronic display. The door frame extends about and is secured to a peripheral edge of the insulated panel assembly. The electronic display overlays the insulated panel assembly. A mounting bezel is secured to the door frame and has a coupling end that extends over an edge of the electronic display securing the electronic display to the door frame. A transparent protective panel is positioned between a front surface of the electronic display and the coupling end of the mounting bezel. A first cover bezel is coupled to a front surface of the door frame, where the first cover bezel is sized to overlay the front surface of the door frame and the coupling end of the mounting bezel, A circuitry module is positioned in a bottom portion of the door frame and overlays a portion of the insulated panel assembly. The circuitry module is releasably coupled to the door frame. The circuitry module includes a media player in electronic communication with the electronic display, where the media player is configured to control media content presented on the electronic display. A power cable is disposed within a channel defined by a portion of the door frame and the power cable is electrically connected to the electronic display and to the media player. A second bezel cover is coupled to the door frame and covers the circuitry module. The second bezel cover includes a plurality of louvres configured to provide cooling air-flow to the media player.

This and other implementations can each optionally include one or more of the following features.

In some implementations, the insulated panel assembly includes an opaque insulating material. In some implementations, the insulated panel assembly includes foam. In some implementations, the insulated panel assembly is a foam filled panel.

In some implementations, the electronic display overlays the insulated panel assembly and overlaps more than 50% of a surface area of the insulated panel assembly.

In some implementations, the electronic display and the circuitry module together overlay the insulated panel assembly and overlap an entire surface area of the insulated panel assembly.

In some implementations, the mounting bezel includes two parallel, vertical members. In some implementations, the coupling end of the mounting bezel includes a flange of each vertical member and a flange of at least one horizontal member, each respective flange extending generally parallel to the insulated panel assembly. In some implementations, a coupling end of each vertical member and a coupling end of one horizontal member extend over the edge of the electronic display overlapping three edges of a housing of the electronic display. In some implementations, each of the vertical members include at least one mounting bracket configured to secure the mounting bezel to the door frame.

In another general aspect, the subject matter described in this specification can be embodied in a display case door that includes an insulated panel assembly, a door frame, and an electronic display mounted to the door. The door frame extends about and is secured to a peripheral edge of the insulated panel assembly. The electronic display overlays the insulated panel assembly. A mounting bezel is secured to the door frame and has a coupling end that extends over an edge of the electronic display securing the electronic display to the door frame. A cover bezel is coupled to a front surface of the door frame, where the cover bezel is sized to overlay the front surface of the door frame and the coupling end of the mounting bezel.

In another general aspect, the subject matter described in this specification can be embodied in a display case door that includes an insulated panel assembly and a door frame extending about and secured to a peripheral edge of the insulated panel assembly. The door frame is configured to support an electronic display mounted thereto. The door frame includes a portion that extends outwards a distance beyond a front surface of the insulated panel assembly, and a plurality of mounting sites arranged along the portion of the door frame. The mounting sites are configured to interface with a display mounting retainer. The electronic display, when mounted, overlays the insulated panel assembly. The distance that the portion extends beyond the front surface of the insulated panel assembly corresponds to a thickness of the electronic display such that, when mounted, a front surface of the electronic display is substantially flush with a front surface of the door frame.

These and other implementations can each optionally include one or more of the following features.

In some implementations, the insulated panel assembly includes an opaque insulating material. In some implementations, the insulated panel assembly includes foam. In some implementations, the insulated panel assembly is a foam filled panel.

In some implementations, the electronic display, when mounted, overlays a majority of the insulated panel assembly.

Some implementations include a transparent protective panel positioned between a front surface of the electronic display and the coupling end of the mounting bezel.

Some implementations include a circuitry module positioned in a bottom portion of the door frame and overlaying a portion of the insulated panel assembly, where the circuitry module is releasably coupled to the door frame, and the circuitry module includes a media player in electronic communication with the electronic display. The media player is configured to control media content presented on the electronic display.

Some implementations include a second cover bezel coupled to the door frame and covering the circuitry module. In some implementations, the second cover bezel includes a plurality of louvers configured to provide cooling air-flow to the media player.

Particular implementations of the subject matter described in this specification can be implemented so as to realize one or more of the following advantages.

Implementations may provide less expensive alternatives to doors with embedded displays. Implementations may improve the maintainability of electronic displays mounted to doors. For example, implementations of the present disclosure may provide for easy replacement or maintenance of electronic displays mounted to a display case door without the need to remove an entire display case door. Implementations of the present disclosure may also allow a display case door with mounted electronic displays to stay close to the original envelope (e.g., the door having a thin profile) so the door does not interfere with the motion of other doors in a continuous lineup of doors. For example, implementations may permit display case doors having electronic displays to be mounted in a continuous lineup of doors (e.g., in a supermarket aisle) without the need to alter the mounting configuration or spacing between doors to accommodate the thickness of the electronic displays.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 16 is a front view of a display case door showing a media player according to a second exemplary embodiment.

FIG. 17 is a front view of an exemplary arrangement of electronic displays in a display case door according to implementations of the present disclosure.

Like reference symbols in the various drawings indicate like elements.

DETAILED DESCRIPTION

Figure 1:
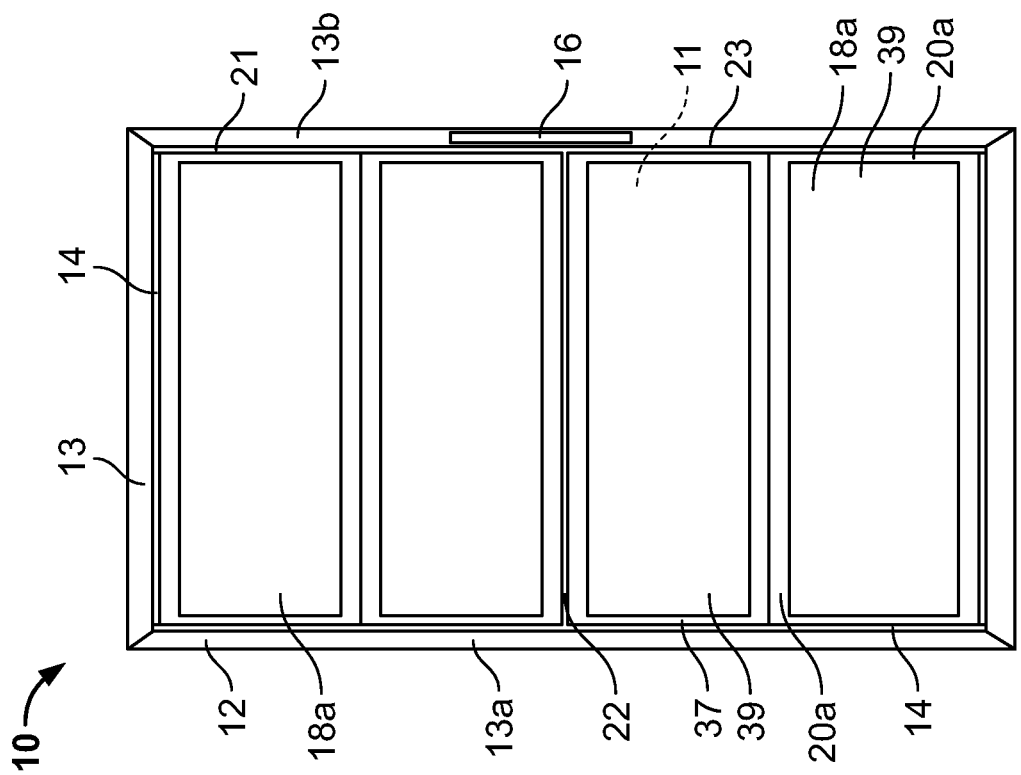
FIG. 1 is a front view of an exemplary arrangement of electronic displays in a display case door according to implementations of the present disclosure.

FIG. 1 is a front view of an exemplary arrangement of electronic displays 18a in a display case door 10 according to implementations of the present disclosure. FIG. 1 illustrates an exemplary display case door 10 configured to be installed in a refrigerated display case such as a refrigerator, a freezer, or other enclosure defining a temperature-controlled space. Display case door 10 includes an insulated panel assembly 11 (shown in FIG. 6), a door frame 12, display retainers 14, and electronic displays 18a overlaying panel assembly 11.

As further discussed in more detail below with respect to FIGS. 24 and 25, the display case door can include an insulated panel assembly, a door frame secured to an edge of the panel assembly, and an opaque display screen (e.g., an electronic display) coupled to the door frame. In some examples, the insulated panel assembly can be an opaque insulating material such as a foam filled panel. In other examples, the insulated panel assembly can be a transparent insulated glass package. The display screen can be mounted to the door frame so as to overlay a majority of the insulated panel assembly. The electronic display can be secured to the door frame by at least one display retainer secured to the door frame. For example, the display retainer has a coupling end that mates with the electronic display to releasably secure the electronic display to the door frame. Additionally, as further discussed in detail below with respect to FIG. 26, a display case door can be made without the electronic display included. For example, the display case door can include an insulated panel assembly and a door frame that is configured to support an electronic display mounted on the door. For example, the door frame of the display case door can include a portion that extends outwards a distance beyond a front surface of the insulated panel assembly. The door frame can also have multiple mounting sites arranged along the portion of the door frame that are configured to interface with a display retainer. The door frame can be configured such that when mounted, the electronic display overlays a majority of the insulated panel assembly. The distance that the portion of the door frame extends beyond the front surface of the panel assembly can correspond to a thickness of the electronic display such that, when mounted, a front surface of the electronic display is substantially flush with a front surface of the door frame.

As discussed in more detail below, panel assembly 11 includes one or more panes of glass. In some implementations, panel assembly 11 includes an opaque thermally insulating panel (e.g., a foam filled panel). In other implementations, panel assembly 11 includes two or more layers of transparent panes bounding a sealed space in between, forming a sealed glass unit (SGU). Door frame 12 extends around and is secured to a peripheral edge of panel assembly 11. Frame 12 defines a channel or tunnel (not shown) configured to receive one or more power cables that provide electrical power to the electronic displays 18a (e.g., monitors).

Figure 6:
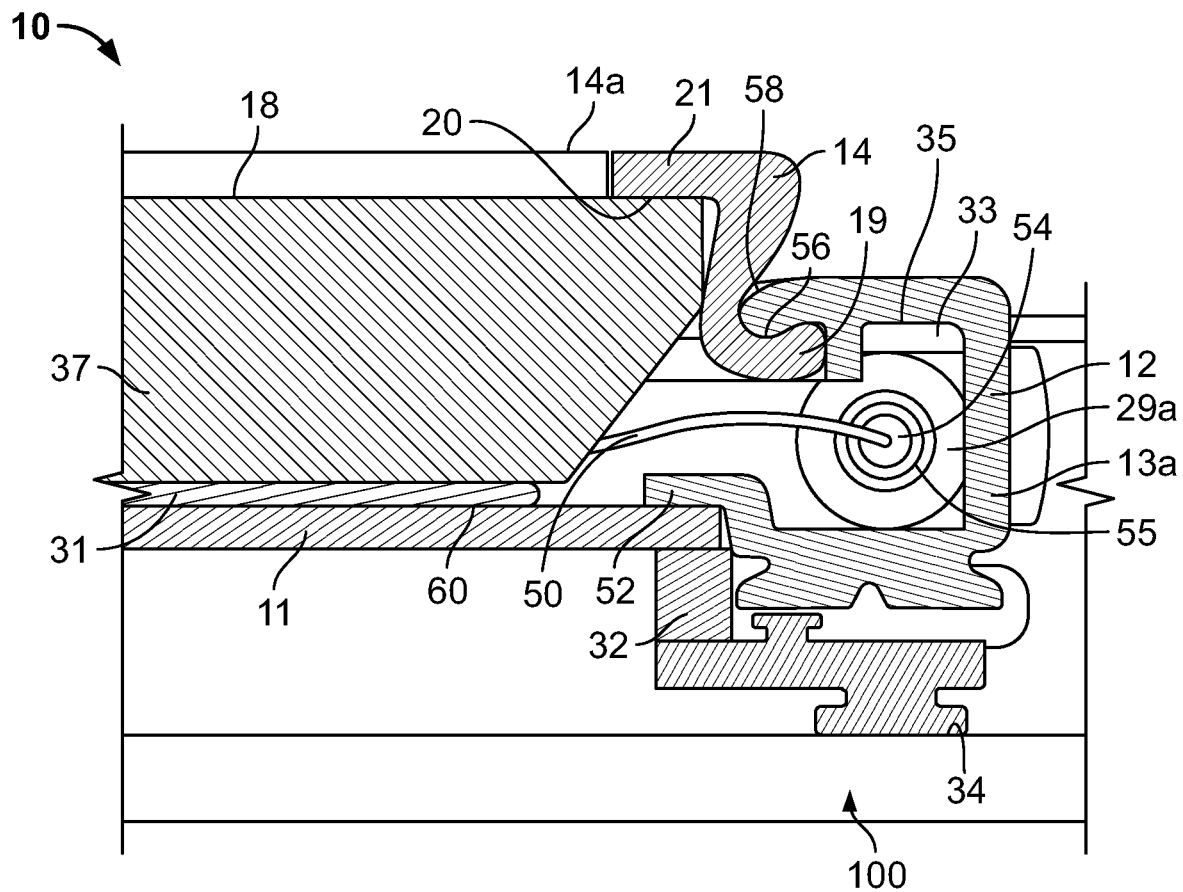
FIG. 6 is a cross-sectional view taken along line 6-6 of a portion of the display case door shown in FIG. 4 according to a first exemplary embodiment.

Display retainers 14 releasably secure electronic displays 18a to the frame 12 of the display case door 10. Display retainers 14 can be made of an extruded metal or hard plastic, such as aluminum or polyvinyl chloride (PVC). Display retainers 14 can be made in different sizes and configuration to mount electronic displays 18a of different thicknesses. Referring briefly to FIG. 6, each display retainer 14 has a first end 19 and a second end 21 (e.g., a coupling end). The first end 19 is arranged to couple to or clip to the frame 12. The second end 21 (e.g., coupling end) configured to extend over an edge 20 of each electronic display 18 to releasably secure electronic displays 18 to frame 12. Referring back to FIG. 1, in some implementations door 10 can include four display retainers 14, each having a length similar to a respective side of frame 12. In some embodiments, display retainers 14 can be shorter than their respective side of frame 12, allowing multiple display retainers 14 along a side of frame 12 to mount electronic displays 18a to the door 10.

Electronic displays 18a include an outer housing 37 and an electronically controllable display panel 39 (e.g., screen) mounted to outer housing 37. Outer housing 37 can be positioned directly against the front surface of panel 11. In some examples, a protecting foam or flexible tape can separate outer housing 37 from the front surface of panel 11. Electronic displays 18a can include, but are not limited to, liquid crystal displays (LCD), light emitting diode (LED) displays, organic light emitting diode (OLED) displays, field emission displays (FED), plasma display panels (PDP), or electroluminescent (EL) displays. For example, electronic displays 18a can be smart televisions with streaming capabilities for receiving content over a wireless network (e.g., a Wi-Fi network).

Display retainers 14 allow electronic displays to be quickly replaced or removed for maintenance or replacement. Retainers 14 also allow electronic displays to be re-arranged in different configurations. Retainers 14 allow electronic displays 18a to be mounted to door 10 without need for special mounting equipment or reconfiguration of the electronic displays housing 37. In the example arrangement shown in FIG. 1, electronic displays 18a are mounted in a one by four arrangement. In other words, the four electronic displays 18a are mounted to door 10 in one column with four rows of displays. As further discussed below, electronic displays 18a can be mounted in different arrangements. For example, multiple electronic displays can be mounted over panel assembly 11, with electronic displays arranged in one column that extends along a height of the panel assembly. In some implementations, multiple electronic displays can be mounted over the panel assembly, with the electronic displays arranged in two or more columns that extend along a height of the panel assembly.

Frame 12 can include four frame rails 13 each made of extruded aluminum, PVC, or a similar material. Frame rails 13 can each have a constant cross-section along their length. One of the frame rails, e.g., frame rail 13a, also referred to herein as hinge rail, can define the channel through which the power cord extends to power electronic displays 18a. As discussed in more detail below, frame 12 further defines openings at a top and bottom thereof for hingedly connecting door 10 to a display case frame. Such openings can be defined at the top and bottom ends of the frame rail channel. The hinges used to connect door 10 can include an electrical connector from which the power cable extends.

Door frame 12 has a width and thickness that allows display case door 10 to be installed and operated in an existing refrigerated display case without the need of retrofitting the display case. Door 10 can be operated with or without electronic displays 18*a*. In some examples, electronic displays 18*a*, when installed, overlap 75% or more of a surface area of the insulated panel assembly 11.

In some implementations, panel assembly 11 is an opaque thermally insulating panel. For example, panel assembly 11 can include a foam filled insulating panel.

In some implementations, panel assembly 11 includes one or more panes of transparent or substantially transparent glass (e.g., insulated glass, non-tempered glass, tempered glass, etc.), plastics, or other transparent or substantially transparent materials (e.g., translucent materials). The panel assembly can be a glass or plastic panel that is transparent to visible light. The transparent panel assembly can be a highly insulating panel, e.g., a panel having an R value of 2 or more, and a U value of less than 0.5. As further discussed in detail with respect to FIG. 6A, panel assembly 11 can include multiple layers of transparent panes. For example, panel assembly 11 can be a multi-pane unit having a first pane and a second pane that are separated by a gap, forming an SGU. Panel 11 can be a thin SGU assembly having a thickness of 1-3 centimeters. Panel 11 can have an insulation R-value of between 2 and 30 or, in some examples, between 4 and 8. The SGU can be a highly insulating panel assembly, e.g., an assembly having an R value of 2 or more, and a U value of less than 0.5. It is not necessary that panel 11 be transparent. In some implementations, panel 11 can be translucent or opaque.

In some implementations, the gap or sealed space can between two or more panels can be filled with an insulating gas such as a noble gas (e.g., Argon, Krypton, etc.) which functions as a thermal insulator to reduce heat transfer through the panel. In some examples, the sealed space can be evacuated below atmospheric pressure. For example, panel assembly 11 can be a vacuum insulated glass (VIG) assembly. For example, a VIG assembly is a SGU in which the sealed space can be an evacuated space below atmospheric pressure. As further discussed in FIG. 8A, panel assembly 11 can be an offset glass package panel assembly. For example, a pane contained within frame 12 can include multiple smaller panes attached to a back surface of the secured pane.

Display case door 10 includes a door handle 16 coupled to frame 12. Door handle 16 can be made from extruded aluminum tubes that are cut to a specified dimension and coupled to a front or side surface of frame 12. Door handle 16 can be a 'pull handle' of different shapes. For example, handle 16 can be a U-shaped handle or a handle with a J-shape cross-section. Handle 16 can be attached to frame 12 by using an adhesive or a mechanical fastener.

Figure 2:
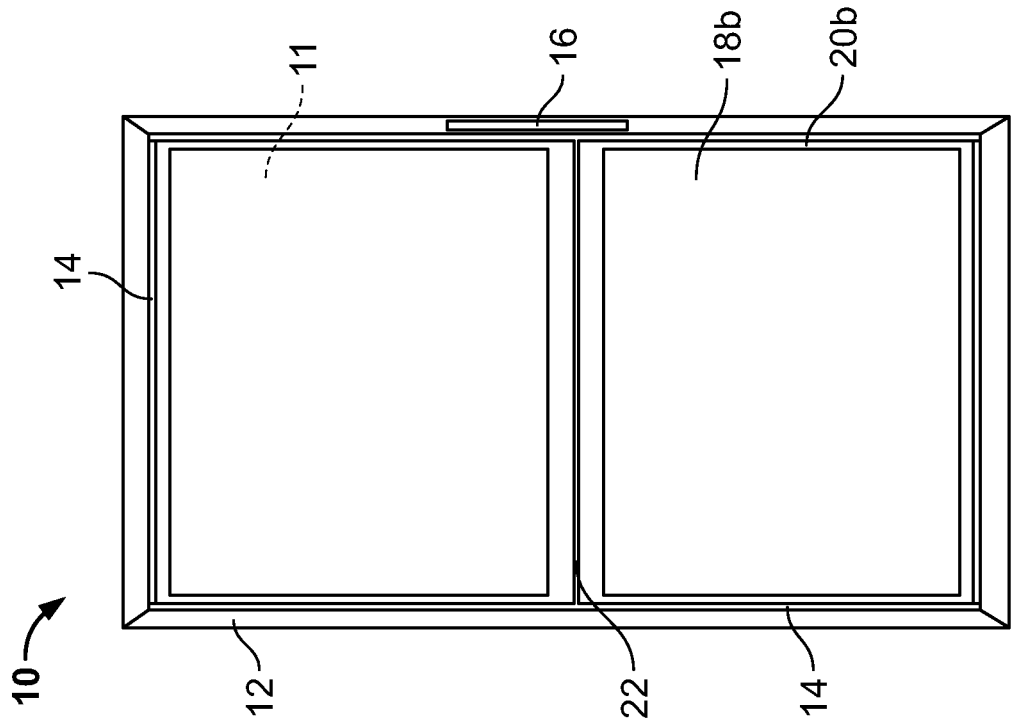
FIG. 2 is a front view of an exemplary arrangement of electronic displays in a display case door according to implementations of the present disclosure.
Figure 3:
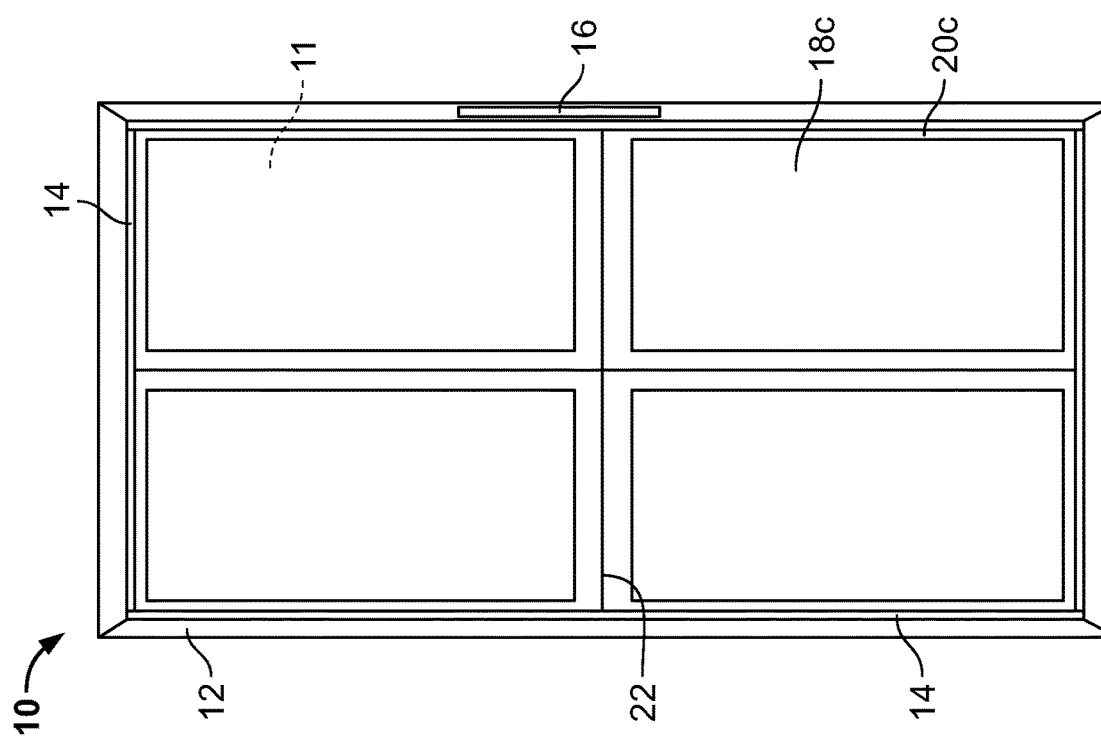
FIG. 3 is a front view of an exemplary arrangement of electronic displays in a display case door according to implementations of the present disclosure.

Referring to FIGS. 1-3, electronic displays 18*a*, 18*b*, and 18*c* can be mounted to door 10 in various different arrangements. For example, FIG. 1 shows a display case door 10 according to a first embodiment, having electronic displays 18*a* mounted in a one by four configuration. FIG. 2 shows another example arrangement of electronic displays mounted on door 10. FIG. 2 shows a display case door 10 according to a second embodiment, having electronic displays 18*b* mounted in a one by two configuration. Similar to how the electronic displays 18*a* in FIG. 1 are mounted on door 10, electronic display retainers 14 extend over an edge 20*b* of electronic displays 18*b* to releasably secure electronic displays 18*b* to the frame 12 of door 10.

FIG. 3 shows another example arrangement of electronic displays mounted on door 10. FIG. 3 shows a display case door 10 according to a third embodiment, having electronic displays 18*c* mounted in a two by two configuration. In other words, FIG. 3 shows four electronic displays 18*c* mounted to door 10 in two columns and two rows of displays. Similarly, display retainers 14 extend over an edge 20*c* of each electronic display 18*c* to releasably secure electronic displays 18*c* to the frame 12 of door 10.

Implementations of the present disclosure provide flexibility in the arrangement of electronic displays on a display case door. For example, the display retainers described herein permit various arrangements of electronic displays. For example, multiple electronic displays can be mounted over panel assembly 11, with electronic displays arranged in one column that extends along a height of the panel assembly 11. In some implementations, multiple electronic displays can be mounted over the panel assembly 11, with the electronic displays arranged in two columns that extend along a height of the panel assembly 11.

In some implementations, all portions of electronic displays 18*a*, 18*b*, and 18*c* can overlay panel assembly 11. For example, the electronic displays can be arranged so as to overlap a majority of the surface area of panel assembly 11. In some implementations, electronic displays 18*a* are arranged to overlap the entire surface area of panel assembly 11. In some examples, electronic displays 18*a* can cover the front surface of panel assembly 11, leaving a small gap 22 between adjacent electronic displays 18*a*. In some examples, a flexible foam or tape (not shown) can fill the gap 22, acting as a cushion between adjacent electronic displays. In some embodiments, electronic displays 18*a* can be arranged to expose one or more areas of the front surface of panel assembly 11. In some implementations, display retainers can be arranged so as to form a venting gap between adjacent display retainers, for air to enter to and ventilate the back of electronic displays 18*a*.

Figure 4:
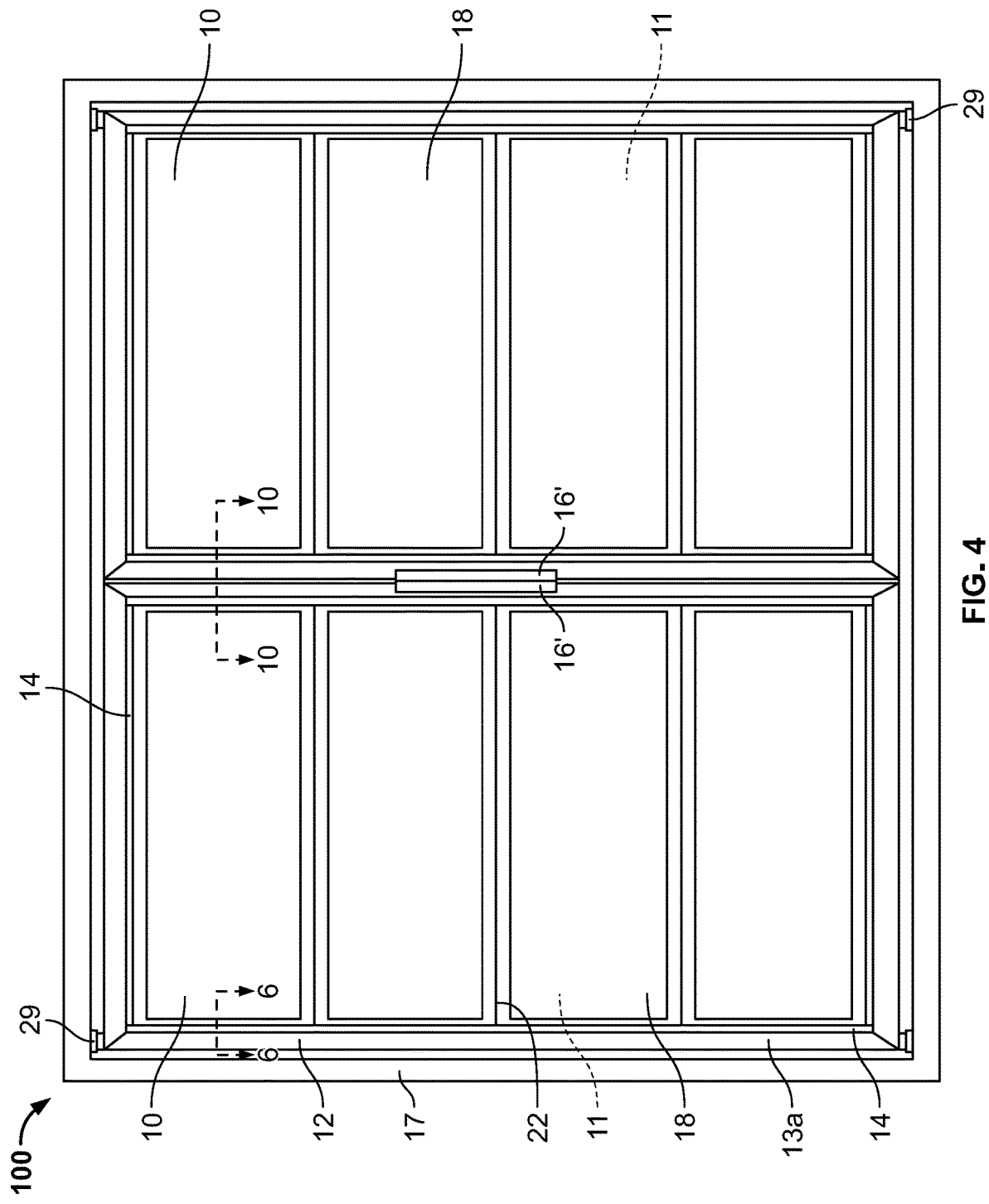
FIG. 4 is a front view of two exemplary display case doors mounted to a display case in a first arrangement.

FIG. 4 is a front view of two exemplary display case doors 10 mounted to a display case 100 in a first arrangement. Refrigerated display case 100 can be a refrigerator, freezer, or other enclosure defining a temperature-controlled space. For example, refrigerated display case 100 can be a refrigerated display case or refrigerated merchandiser in grocery stores, supermarkets, convenience stores, florist shops, and/or other commercial settings to store and display temperature-sensitive consumer goods (e.g., food products and the like). Refrigerated display case 100 can be used to display products that must be stored at relatively low temperatures. In some implementations, refrigerated display case 100 is a refrigerated display unit used, for example, in warehouses, restaurants, and lounges. For example, refrigerated display case 100 can be a free-standing unit or "built-in" unit that forms a part of the building in which the refrigerated display case 100 is located.

As illustrated, refrigerated display case 100 has multiple display case doors 10 mounted on a display case frame 17. Each door 10 is pivotally mounted on hinges 29 that connect the door 10 to frame 17. Hinges 29 of each door 10 are in opposite ends of case frame 17, allowing doors 10 to pivot about points located at two opposite ends of case frame 17. In such configuration, handles 16' are adjacent to one another. In some implementations, each handle 16' is attached to a side surface of a respective door frame 12. For example, handles 16' can have a J-shaped cross-section, in which a flange of handle 16' is attached to a side surface of frame 12. In some examples, the handles can be U-shaped handles attached to a front surface of frame 12. In some implementations, doors 10 can be sliding doors configured to open and close by sliding with respect to case frame 17. For example, hinges 29 can be replaced by a pair of corresponding rails coupled, respectively, to each door 10 and case frame 17.

Figure 5:
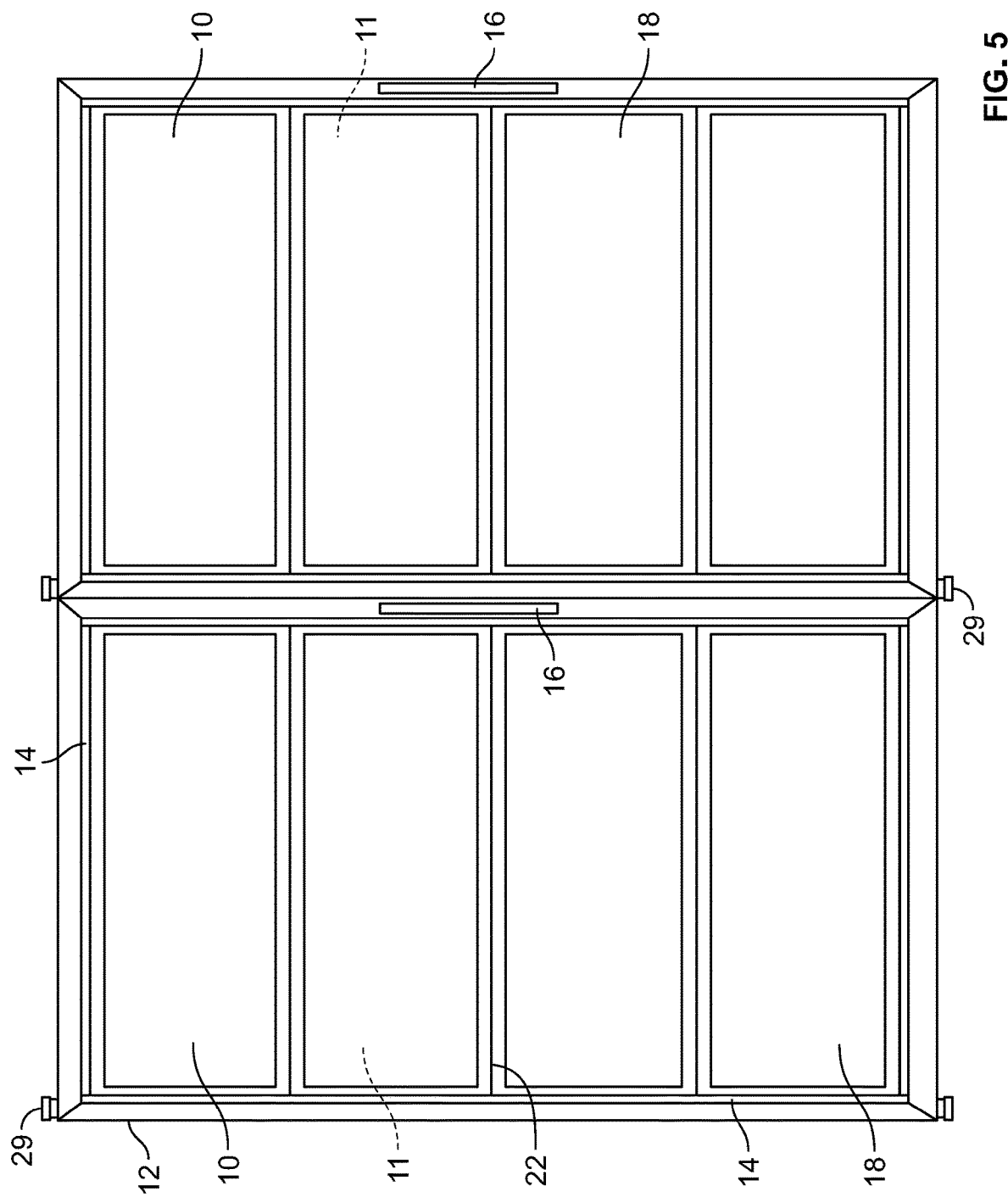
FIG. 5 is a front view of two exemplary display case doors mounted to a display case in a second arrangement.

FIG. 5 is a front view of two exemplary display case doors 10 mounted to a display case 100 in a second arrangement. For example, doors 10 are installed in an arrangement in which hinges 29 are placed on the same side of each door 10. Doors 10 open in the same direction, which may be advantageous for a long row of doors (e.g., in a supermarket aisle). For example, the arrangement shown in FIG. 5 may leave more room for consumers to open doors 10, as opposed to doors with adjacent handles such as in the example shown in FIG. 4.

FIG. 6 is a cross-sectional view taken along line 6-6 of a portion of the display case door 10 shown in FIG. 4. Frame 12 includes a frame rail 13*a* and a display retainer 14. Frame rail 13*a* defines a channel 33 that extends along the length of the frame rail 13*a*. Channel 33 can have a channel opening along the length of frame rail 13*a* that allows power cables 50 to extend away from channel 33 to electronic displays 18.

In some implementations, frame rail 13*a* can serve as a hinge rail. For example, a bottom opening 35 of frame rail 13*a* 35 can be configured to receive a bottom hinge 29*a* (e.g., a pin hinge). Hinge 29*a* can be attached to the frame of case 100 and inserted into the bottom of opening 35. Bottom hinge 29*a* can be an electrical hinge from which one or more power cables 50 extend. For example, hinge 29*a* can include an electrical connector 54 from which each power cable 50 extends. In some examples, electrical connector 54 includes a 120V electrical plug. Electrical plug 54 can include a sleeve 55 that extends into channel 33 to cover power cable 50, and is configured to guide cable 50 into channel 33. In some implementations, bottom hinge 29*a* can be a gravity hinge and the top hinge (not shown) can be an electrical hinge from which power cables 50 extend. In some implementations, other electrical cables can extend from hinge 29*a*. For example, panel assembly 11 may include an anti-condensation system that requires power for heating the panel 11 (e.g., providing power to an electro-conductive coating), in which additional electrical conductors may provide such power. In some implementations, instead of hinges 29, the display case door can be mounted to case 100 using any type of appropriate hinges such as knuckle hinges or ball bearing hinges.

In the example arrangement shown in FIG. 6, display retainer 14 is an over-center clip with an S-shaped cross-section. Display retainer 14 can be a self-locking longitudinal clip that zips, for example, to electronic display edge 20 from a top of electronic display 18 to a bottom, or from bottom to top. In some implementations, display retainer 14 can be a hard plastic that is slightly bendable to clip over electronic display frame 20. Display retainer 14 includes a first end 19 configured to clip to inner surface 56 of frame rail 13*a*. Display retainer 14 includes a coupling end 21 opposite first end 19, extending offset from frame 12. Coupling end 21 is spaced away from a peripheral frame edge 58 of door frame 12, and away from front surface 60 of panel 11. Coupling end 21 is configured to extend over electronic display edge 20 to secure electronic display 18 to frame 12. In some implementations, display retainer 14 can clamp or wrap the electronic display edge 20 as display retainer 14 is rotated into position. For example, as display retainer rotates about edge 58 from a generally diagonal position (i.e., disengaged position) to a vertical position, coupling end 21 begins to engage electronic display edge 20. Display retainer 14 provides a clamping force between frame rail 13*a* and the edge 20 of electronic display. Display retainer can be secured to the inner surface 56 of frame rail 13*a* by the clamping force. In some implementations, the first end 19 of display retainer 14 can be attached to inner surface 56 with an adhesive.

To remove an electronic display 18, display retainer 14 can be rotated back from a vertical position to a diagonal position. A bottom display retainer 14*a* can secure a bottom edge of a bottom electronic display in a similar way. Similarly, display retainers 14 along the rest of door frame 12 can secure each electronic display 18 into place.

Electronic displays 18 can be positioned directly against front surface 60 of panel 11. For example, a back surface of outer housing 37 can be sufficiently soft to prevent or reduce scratching of panel 11 when electronic displays 18 come into contact with panel 11. In some implementation, a protecting foam or flexible tape 31 can separate outer housing 37 from front surface 60 of panel 11.

Frame rail 13*a* further includes a channel 52 into which panel 11 is secured to frame 12. Panel 11 can be bonded to frame 12 within channel 52 with an adhesive, such as an epoxy or polyurethane. A spacer 32 or an adhesive such as acrylic can also be used to secure panel 11 to frame 12. In some examples, a mechanical fastener such as a clamp may be used to secure panel 11 to frame 12. Display case 100 includes other structures for attaching door 10 to display case 100, such as mullions, gaskets 34, and other associated hardware often included in display case doors.

Figure 7:
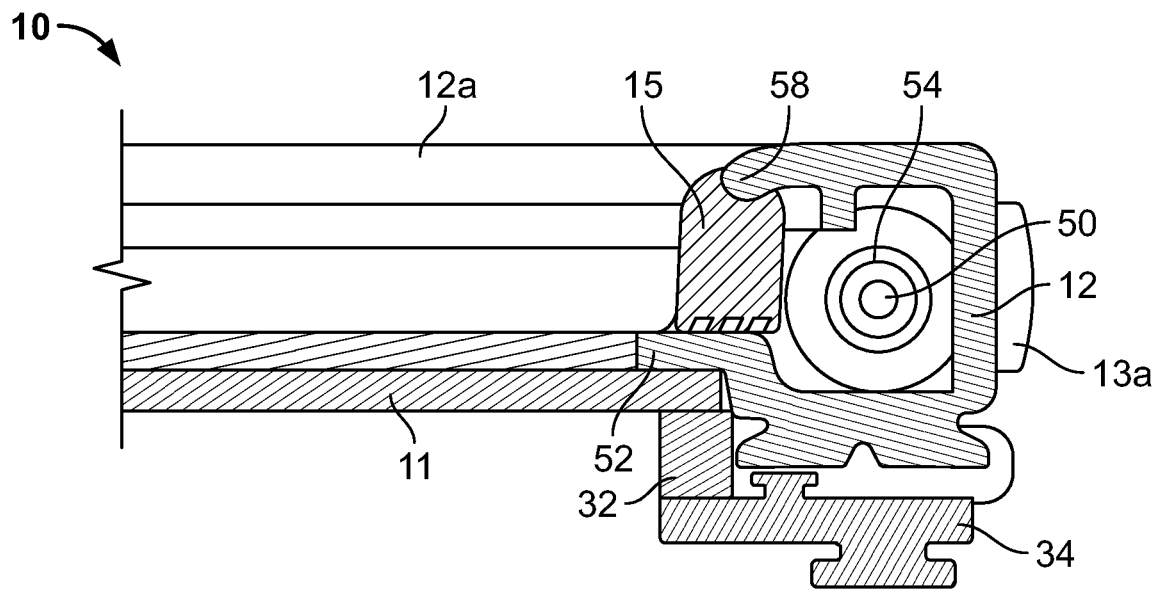
FIG. 7 is a cross-sectional view of the portion of the display case door shown in FIG. 6 without electronic displays.

FIG. 7 is a cross-sectional view of the portion of the display case door 10 shown in FIG. 6. FIG. 7 illustrates a door 10 without electronic displays mounted to it. The electronic displays can be removed from door 10 without impairing the functionality of door 10. The electronic displays can be quickly removed by disengaging the retainers 14 from the electronic display 18. For example, the retainers 14 can be disengaged by unzipping, unclipping, or removing the over-center clips from the electronic display edges. Frame 12 can receive a frame plug 15 that covers power cables 50 and electrical connector 54. Frame plug 15 can be a flexible plastic strip with a constant cross-section configured to snug into the opening formed between frame edge 58 and the panel receiving portion 52 of frame rail 13*a*. Plug 15 may protect cable 50 and connector 54 from the outside environment and may improve the aesthetic appearance of frame 12.

Figure 8A:
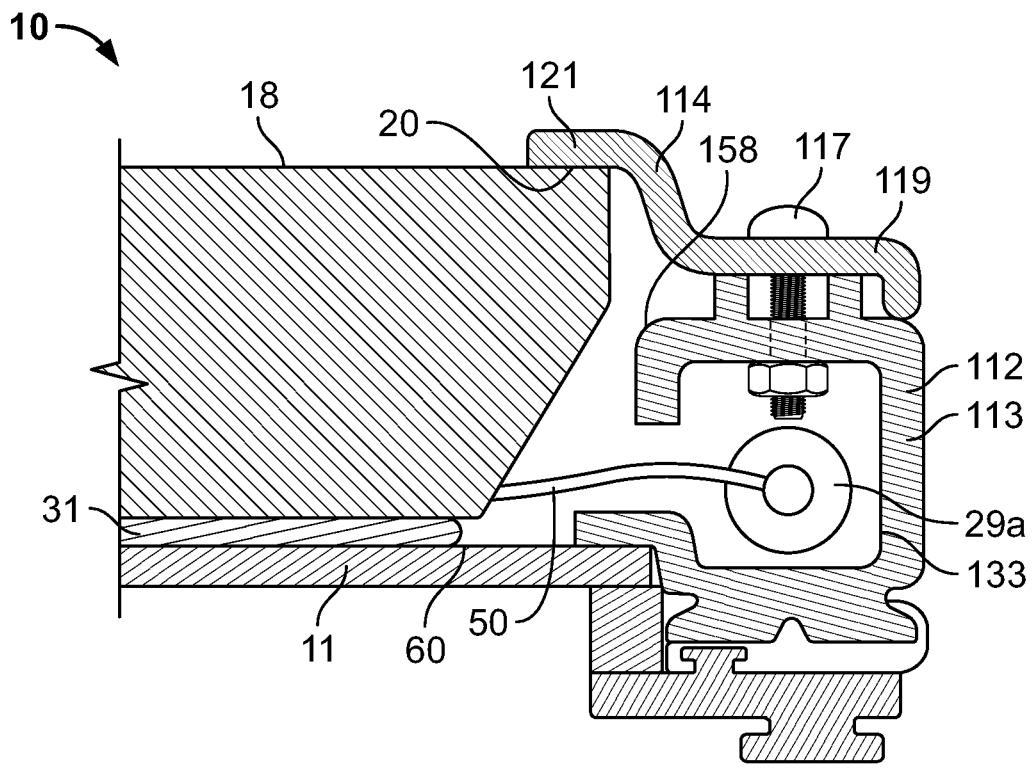
FIG. 8A is a cross-sectional view of the portion of the display case door shown in FIG. 6 according to a second exemplary embodiment.

FIG. 8A depicts a detail view of the portion of the display case door shown in FIG. 6, according to a another example implementation. Similar to the frame rail in FIG. 6, frame rail 113 is configured to receive bottom hinge 29*a* and power cable 50 within channel 133. In the example arrangement shown in FIG. 8A, display retainer 114 is a door trim made of hard plastic (e.g., PVC) or an extruded metal such as aluminum. Similar to display retainer 14 in FIG. 6, retainer 114 releasably secures electronic displays to door frame 114. Display retainer 114 has a first end 119 coupled to frame rail 113, and a coupling end 121 extending over electronic display edge 20 to releasably secure electronic display 18 to frame 112. In some examples, first end 119 is a flange attached to a front surface of frame rail 113. Flange 119 can be attached to frame rail 113 with one or more mechanical fasteners 117 passing through a front surface of frame rail 113. Coupling end 121 extends away from first end 119 and is spaced away from a peripheral frame edge 158 of door frame 112, and away from front surface 60 of panel assembly 11. To install a electronic display, a electronic display can be placed over panel 11, and a flange 119 can be placed over both, electronic display edge 20 and frame rail 113, to secure the flange 119 to frame rail 113 (e.g. with mechanical fastener 117). To remove a electronic display 18 from door 10, display retainers 114 securing the electronic display 18 may be quickly removed by removing mechanical fastener 117 from frame rail 113.

Figure 8B:
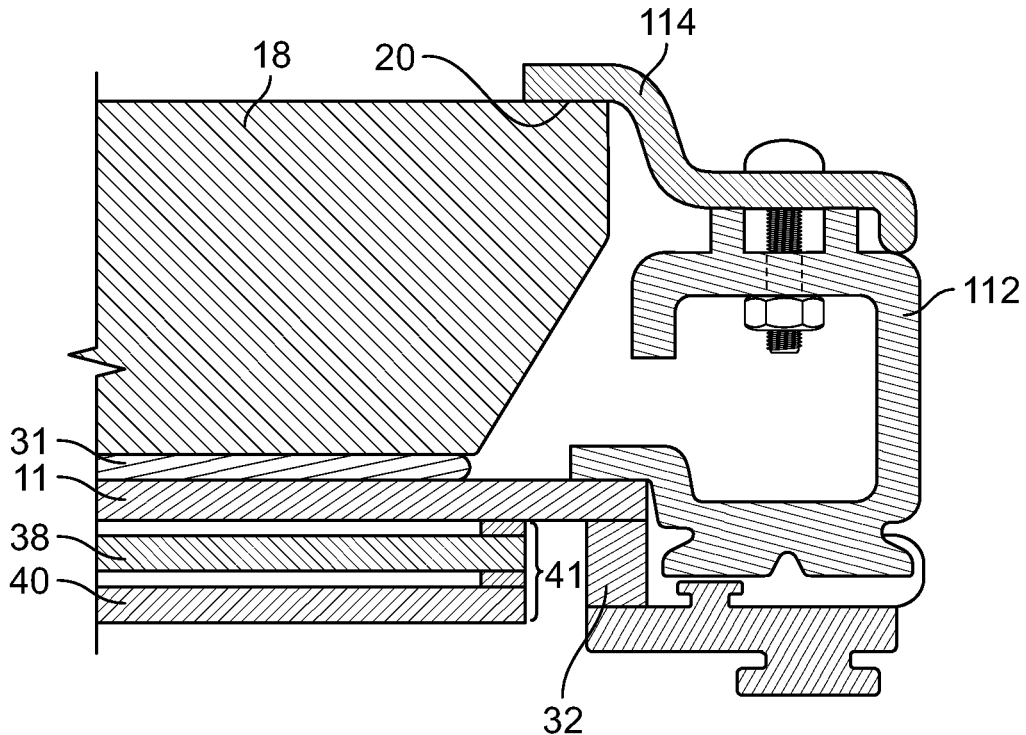
FIG. 8B is a cross-sectional view of the portion of the display case door shown in FIG. 8A, according to a third exemplary embodiment.

FIG. 8B depicts a detail view of the portion of the display case door 10 shown in FIG. 6, according to another example implementation. FIG. 8B illustrates a panel assembly 11 according to a different embodiment. Panel 11 includes an offset glass package panel assembly 41. Panel assembly 11 is illustrated as an offset panel assembly. An offset panel assembly 41 can include one more additional transparent panels (e.g., panels 38 and 40) bonded to a first panel to form an SGU (e.g., panel assembly 11). In the example arrangement shown in FIG. 8B, panes 38 and 40 have a smaller surface area than pane 11, and are bonded to a back surface of pane 11. Offset panel assembly 41 is not limited to being installed in the implementation of frame 12 shown in FIG. 8B. Offset panel assembly 41 can be installed in any of the implementations of frame 12 described herein.

Figure 8C:
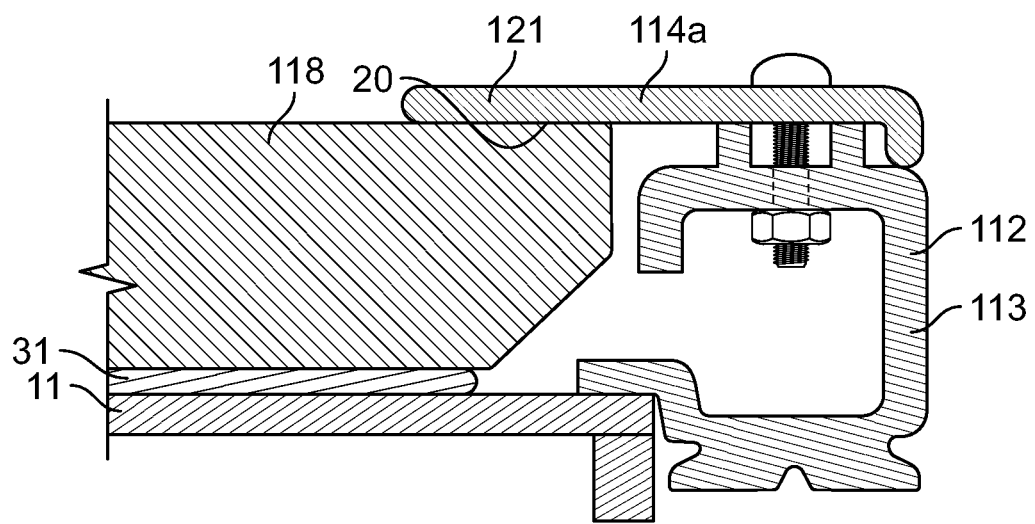
FIG. 8C is a cross-sectional view of the portion of the display case door shown in FIG. 8A, according to a fourth exemplary embodiment.
Figure 12:
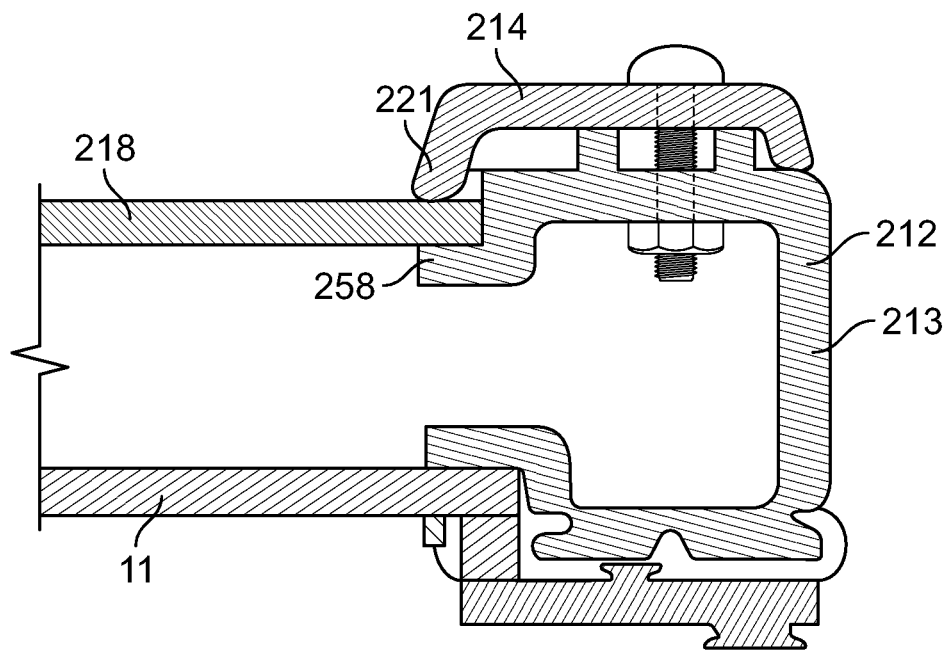
FIG. 12 is a cross-sectional view of the portion of the display case door shown in FIG. 8A, according to a sixth exemplary embodiment.

FIG. 8C is a cross-sectional view of the portion of the display case door shown in FIG. 8A, according to another implementation. FIG. 8C depicts a frame rail and panel similar to the example shown in FIG. 8A, with a retainer 114a configured to accommodate an electronic display 118 with a narrower thickness. For example, each electronic display 118 shown in FIG. 8C has a thickness smaller than a thickness of frame 112. A front surface of electronic display 118 is generally coplanar with a front surface of frame 112. Display retainer 114a is a generally flat strip attached to frame rail 113 with a mechanical fastener. Display retainer 114a has a coupling end 121 that extends over electronic display edge 20 to releasably secure electronic display 118 to frame 112. In some embodiments, electronic display 118 may be thinner (e.g., having a front surface below frame 112), in which display retainer 114 can have a coupling end 121 that extends offset from frame 112 toward glass pane 11 (e.g., as shown in FIG. 12 which is described below).

Figure 9:
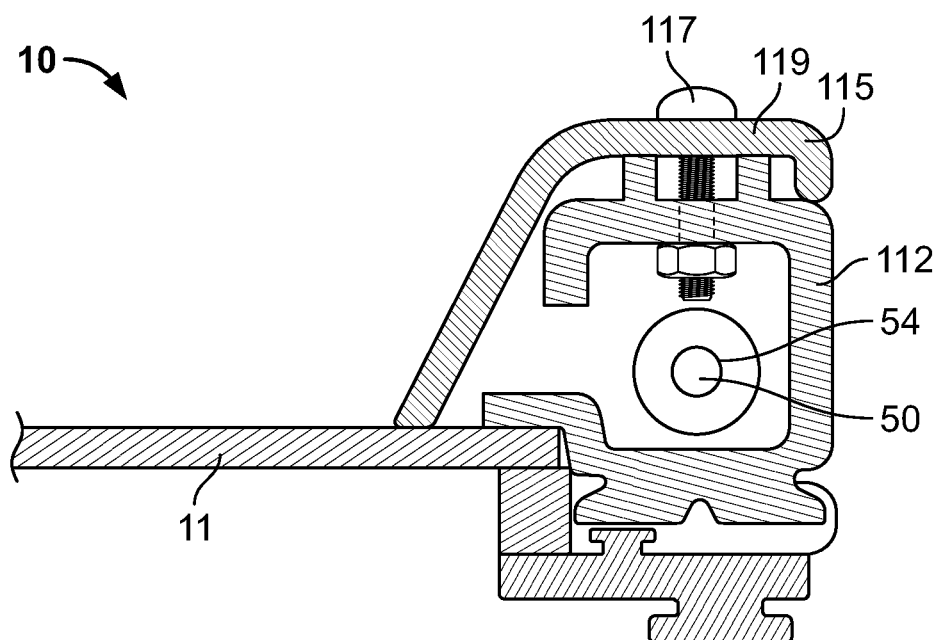
FIG. 9 is a cross-sectional view of the portion of the display case door shown in FIG. 6, according to a fifth exemplary embodiment.

FIG. 9 is a cross-sectional view of the portion of the display case door shown in FIG. 8A, without electronic displays mounted to the door. The electronic displays can be quickly removed by removing the retainers 114 (shown in FIGS. 8A, 8B, and 8C). A blocking trim 115 can be installed the same way trim 114 is installed in the door frame as shown FIG. 8A, by attaching flange 119 to a surface of frame 112. Flange 119 can be attached using a mechanical fastener 117. Blocking trim 115 covers power cables 50 and electrical connector 54. Blocking trim 115 may protect cable 50 and connector 54 from the outside environment and may improve the aesthetic appearance of frame 112. In some implementations, the frame plug 15 shown in FIG. 7 and blocking trim 115 can be used interchangeably. For example, in the arrangement shown in FIG. 9, frame plug 15 can be used instead of blocking trim 115.

Figure 10:
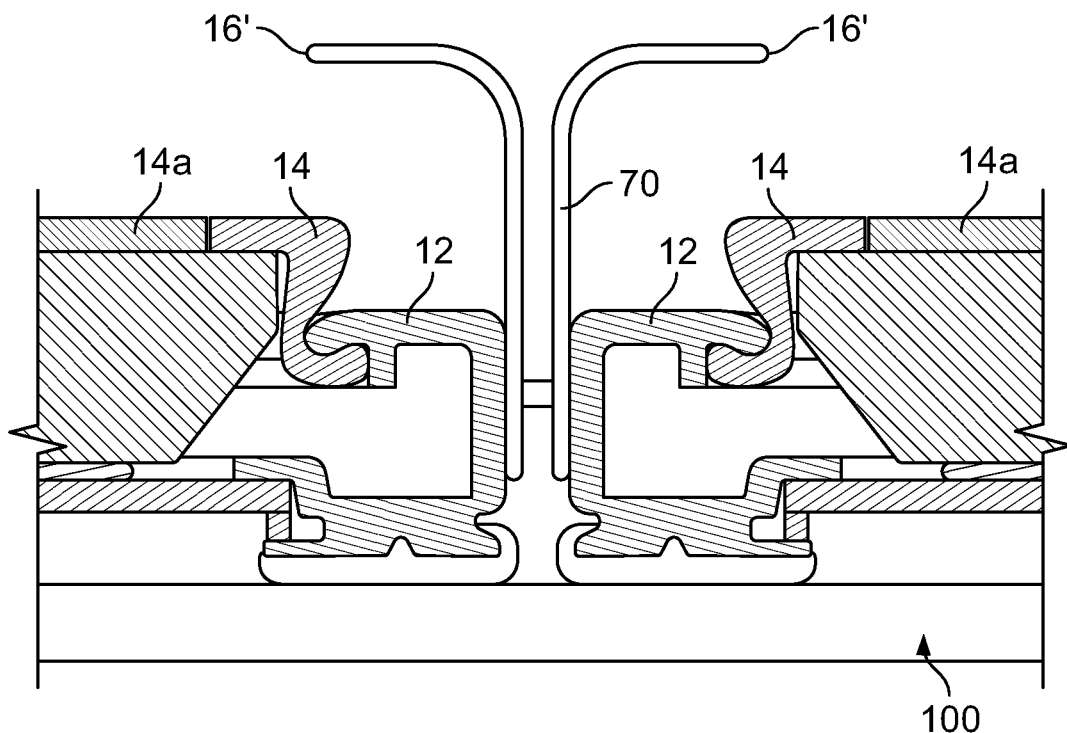
FIG. 10 is a cross-sectional view of a portion of the display case door shown in FIG. 4, taken along line 10-10 in FIG. 4.
Figure 11:
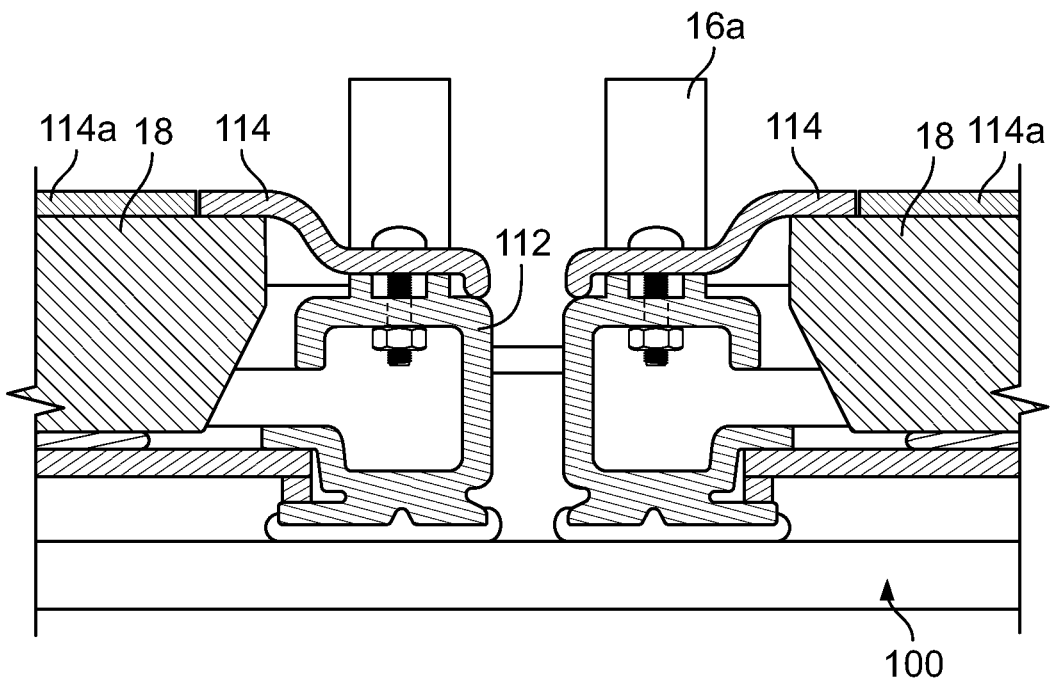
FIG. 11 is a cross-sectional view of the portion of the display case door shown in FIG. 10, according to a second exemplary embodiment.

FIGS. 10 and 11 depict cross-sectional views of a portion of the display case door shown in FIG. 4, taken along line 10-10 in FIG. 4, according to two implementations. FIG. 10 illustrates handles 16' with a J-shaped cross-section. Handles 16' are attached to doors 10 adjacent to one another. Each handle 16' is attached to a side surface of a respective door frame 12. A handle flange 70 is attached to a side surface of frame 12. Though display retainers 14 are shown securing electronic displays to doors 10, door trims can also be used instead of display retainers 14.

FIG. 11 shows door handles 16a attached to frame 112 through retainers 114. Handles 16a can be attached to the door by using an adhesive or mechanical fasteners that pass through the retainer 114 to the door frame 112.

FIG. 12 depicts a cross-sectional view of the portion of the display case door shown in FIG. 8A, according to another implementation. FIG. 12 depicts a frame rail and panel similar to the example shown in FIG. 8A, with a retainer 214 configured to accommodate an electronic display 118 with thickness narrower than frame 12. Electronic display 218 can be a thin display such as an OLED display. Electronic display 218 is secured to frame 212 to leave a gap between display 218 and panel assembly 11. A display retainer 214 in the form of a trim piece can be attached to frame 212 to engage electronic display 218 at coupling end 221 of display retainer 214. Coupling end extends offset from frame 212 toward panel 11. Frame 212 includes a peripheral frame edge 258 extending from a side of frame 212 to form a channel in cooperation with coupling end 221, into which electronic display 218 is received and secured.

Figure 13:
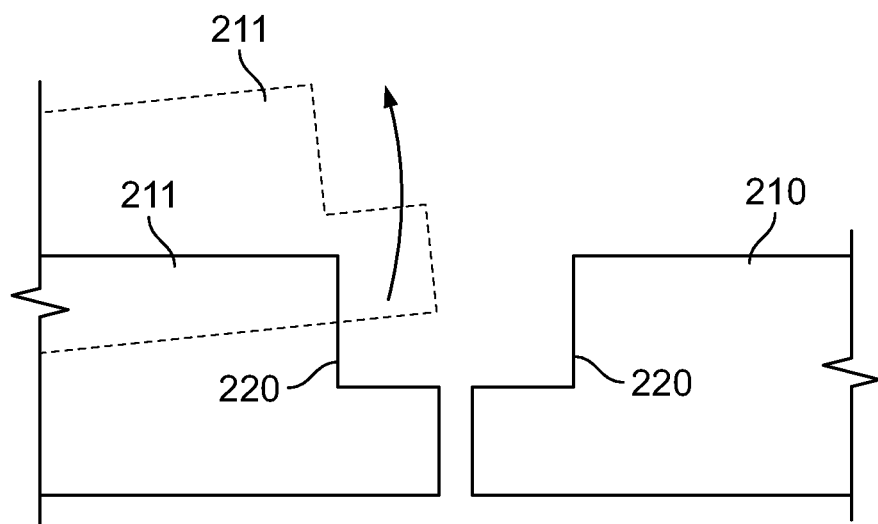
FIG. 13 is a schematic top view of two adjacent doors, showing the motion of a door.

FIG. 13 is a schematic top view of two adjacent doors 211 and 210, in which a first door 211 is opened while a second door 210 remains closed. Doors 210 and 211 represent the doors and configuration shown in FIGS. 10 and 11. Doors 210 and 211 have a cross-sectional shape with an inset 220 that allows a door to open without touching the door that remains closed. The inset corner 220 is representative of the cross-sectional shape formed when the door frames secure an electronic display using the display retainers described in the present disclosure. Because the display retainers are offset from the edge of the door frame, doors 210 and 211 retain a similar thickness around the door edges to existing doors. This may permit users to replace existing doors in a continuous line up of doors (e.g., in a supermarket aisle) without the need to alter the mounting configuration or spacing between doors to accommodate the thickness of the electronic displays. For example, an arrangement where mounted electronic displays increase the thickness of the doors 210 and 211 at the edges may cause the doors to bind against each other if mounted too closely. Such arrangements may require refrigerated display cases to be retrofitted to increase the space between adjacent doors.

Figure 14:
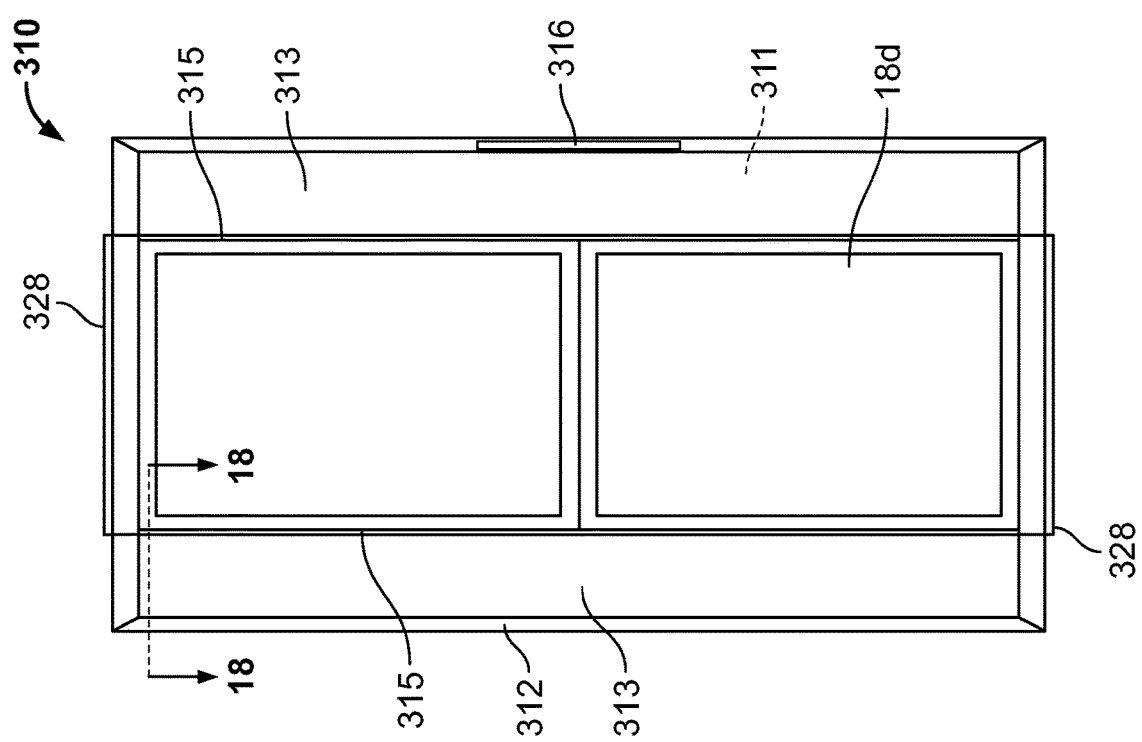
FIG. 14 is a front view of another exemplary display case door according to implementations of the present disclosure.

FIG. 14 illustrates an exemplary display case door 310 according to another embodiment. Display case door 310 includes a panel assembly 311 (shown in FIG. 18), a door frame 312, covers 313, electronic displays 18d, a transparent cover 328, and a handle 316. Similar to the door 10 in FIG. 1, panel assembly 311 can include a single glass panel, a VIG panel, or a glass-filled panel assembly. Electronic displays 18d are mounted in a one by two configuration, overlaying a portion of panel assembly 311. In some examples, multiple electronic displays (e.g., more than two) can be arranged in one column that extends along a height of the panel assembly 311. As further discussed in detail below with respect to FIG. 15, electronic displays 18d are mounted on display case door 310 by a mounting arm (not shown) that is attached to door frame 312. Covers 313 cover the mounting arm and the surface of panel assembly 311 that is not covered by electronic displays 18d. Covers 313 are attached to frame 312 and extend to a side edge 315 of electronic displays 18d. Covers 313 are opaque. Covers 313 can be made of plastic or rubber. In some example, covers 313 cover wiring (e.g., power cables 325 and electronic components 326, 330). Covers 313 may serve as protection for consumers from the electrical cables and electronic components contained within the door 310 and described in more reference below.

Transparent cover 328 overlaps electronic displays 18*d* and can be coupled to door frame 312 or to the electronic displays 18*d*. Transparent cover 238 can have a latch (not shown) along one or more edges to snap over an edge of door frame 312 or electronic displays 18*d*. In some examples, transparent cover can be attached to door frame 312 using mechanical fasteners. Transparent covers 328 can be made of hard plastic or glass. Transparent cover 328 can be a bezel cover that protects the electronic displays 18*d* from damage. For example, a bezel cover may protect the electronic displays 18*d* from a consumer bumping the display door 310 with a shopping cart.

Figure 15:
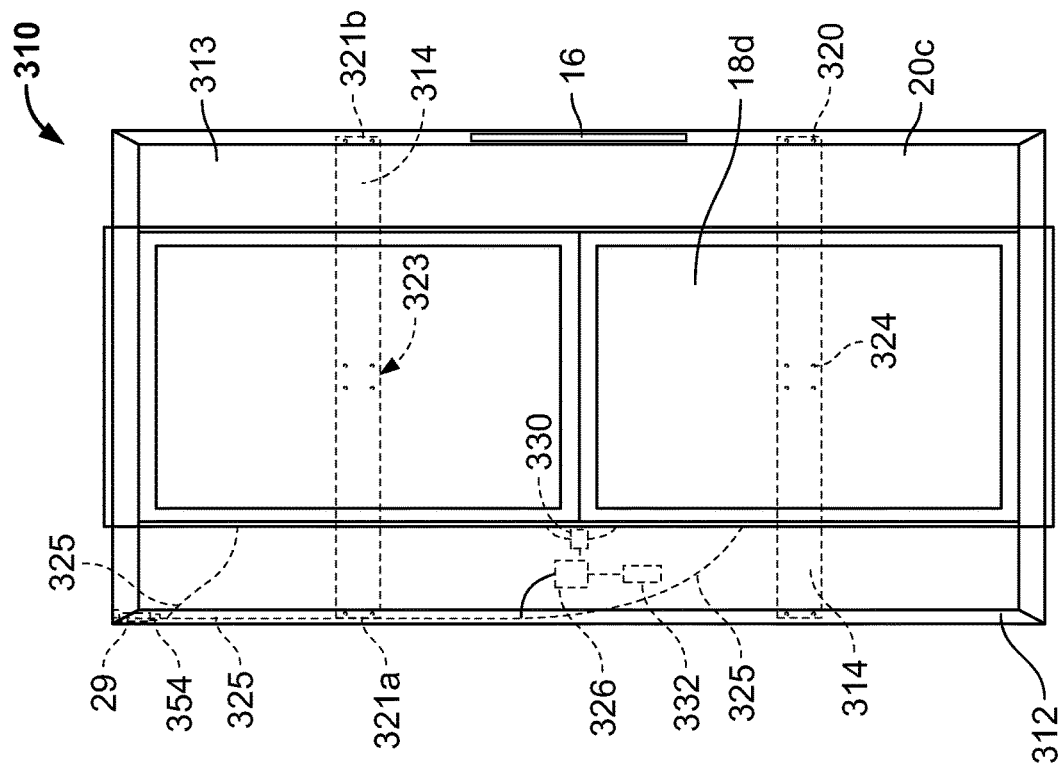
FIG. 15 is a front view of the display case door in FIG. 14, showing mounting arms and a media player according to a first exemplary embodiment.

FIG. 15 illustrates the door in FIG. 14 showing components (shown in dashed lines) that are covered by covers 313, electronic displays 18*d*, and frame 312. Each mounting arm 314 has a mounting interface 323 that is configured to secure a respective electronic display 18*d* to the mounting arm. Mounting interface 323 is a pattern of fasteners or fastening points that secure electronic display 18*d* to mounting arm 314. More specifically, mounting interface 323 includes a plurality of apertures 324 with mechanical fasteners extending therethrough to thread into corresponding holes (not shown) in a back surface of electronic display 18*d*. The pattern of fasteners can be configured to match a corresponding pattern on the back of electronic display 18*d*. Each mounting arm 314 has a first end 321*a* attached to a first inner flange (shown in FIG. 18) of frame 312 and a second end 321*b* attached to a second inner flange opposite the first flange so that the mounting arm 314 extends along a width of panel assembly 313. Each of the first and second end of mounting arm 314 are secured to frame 312 by fasteners 320. Mounting arms 314 can be made of plastic or metal such as aluminum.

Similar to the display case door in FIG. 1, door frame 312 can include top and bottom openings (not shown) configured to receive a hinge 29 (e.g., an electrical hinge pin) through which a power cable 325 extends. In some implementations, the bottom hinge (not shown) can be a gravity hinge and top hinge 29 can be an electrical hinge pin through which one or more power cables 325 extend. In some implementations, other electrical cables can extend from hinge 29, such as a conductor to power an anti-condensation system, or a data cable (e.g., a USB or Ethernet cable). Electrical hinge 29 includes an electrical connector 354 (e.g., 120V electrical plug) to which power cable 325 connects to receive power.

Power cable 325 branches into multiple cables that each connect to a respective electronic display 18*d* and a power converter 326. Power cables 325 provide electrical power to electronic displays 18*d* and power converter 326. Power converter 326 receives alternating current (AC) power from power cable 325 and converts the AC power to direct current (DC) power. For example, power converter 326 converts 110V AC power to 5V DC power. Power converter 326 is electrically connected to one or more media players 330. Power converter 326 is arranged inside the door 310. For example, power converter 326 can be positioned between the panel assembly 311 and a cover 313. Power converter 326 can be positioned between the panel assembly 311 and an electronic display 18*d*. In some examples, power converter 326 is coupled to a mounting arm 314.

Media player 330 can be any type of digital media player device or streaming media player device. Media player 330 is arranged inside the door 310. For example, media player 330 can be positioned between the panel assembly 311 and a cover 313. Media player 330 can be positioned between the panel assembly 311 and an electronic display 18*d*. In some examples, media player 330 is coupled to a mounting arm 314.

In some examples, each electronic display 18*d* is communicatively connected to a respective media player 330 that is powered by power converter 326. USB power hub 332 has multiple USB ports that provide power to electronic devices such as cameras and touchscreen devices (shown in FIG. 20). In some examples, power converter 326 is also electrically connected to a power bar or universal serial bus (USB) power hub 332.

FIG. 16 shows an implementation of a display case door 410 with the media player 330 being external to display case door 410. Media player 330 can be secured to a frame of the refrigerated display case (shown in FIG. 4) or to any surface near display case door 410. Similar to the door in FIG. 15, power converter 326 can provide power to media player 330 and a USB power hub 332.

FIG. 17 illustrates an exemplary display case door 510 according to another embodiment. Display case door 510 includes smaller electronic displays 18*e* that, when mounted to door 510, do not cover areas of the panel assembly 311 above and below the electronic displays 18*e*. To cover the exposed areas of the panel assembly, two covers 313*a* are placed each adjacent a respective top and bottom edge of electronic displays 18*e*, between covers 313. Covers 313*a* can be attached to door frame 312 the same way covers 313 are attached to door frame 312.

Figure 18:
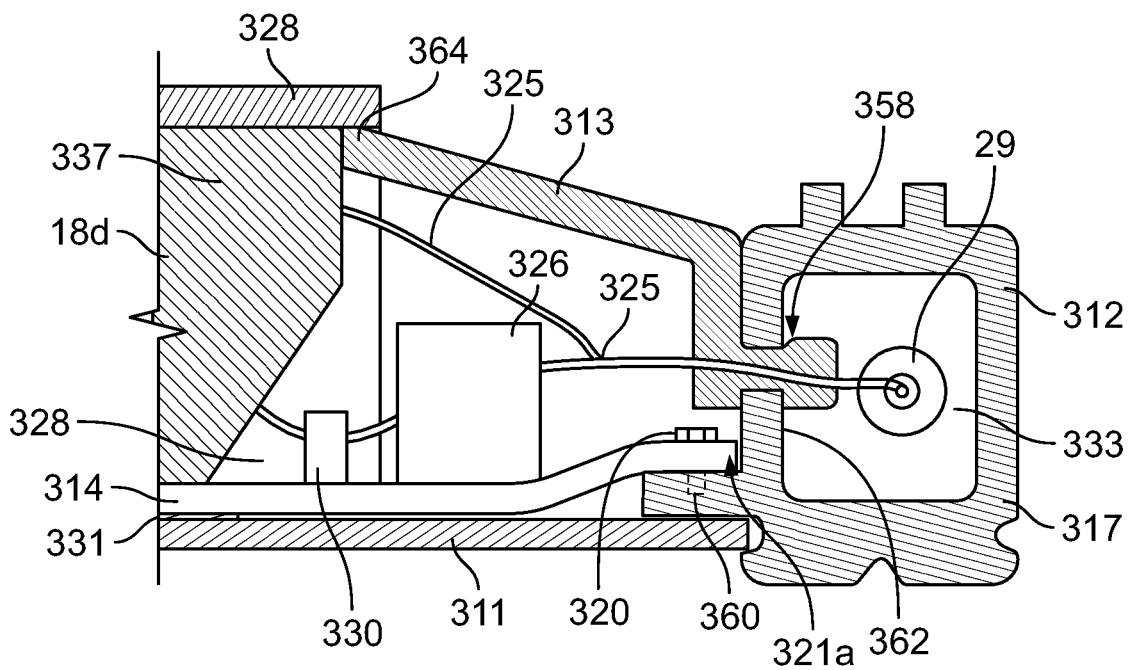
FIG. 18 is a cross-sectional view taken along line 18-18 of a portion of the display case door shown in FIG. 14, according to a first exemplary embodiment.

FIG. 18 is a cross-sectional view taken along line 18-18 of a portion of the display case door 310 shown in FIG. 14. Similar to the cross-sectional view in FIG. 6, frame rail 317 is configured to receive a bottom hinge 29 and a top hinge (not shown). Either top hinge or bottom hinge can be electrical hinges from which power cable 325 extends. A portion of power cable 325 is disposed within channel 333 and extends from channel 333 between cover 313 and panel assembly 311. Power cable 325 is electrically connected to electronic displays 18*d*. Power converter 326, media player 330, and power hub (not shown) can be attached to either one of the mounting arms 314, the cover 313, or to the electronic display 18*d*.

Cover 313 includes a first end 364 spaced away from an outer peripheral edge of door frame 312 and away from a front surface of panel assembly 311. Cover 313 additionally includes a second end 358 configured to clip or snug in to an inner surface 362 of door frame 312. In some examples, first end 364 is flush against an outer peripheral edge of the electronic display 18*d*. This arrangement allows cover 313 to cover the surface of panel assembly 311 that is not covered by electronic displays 18*d*. Cover 313 can be a bezel cover made of an opaque plastic or a metal. Cover 313 protects the power cables 325 and electronic components (e.g., power converter 326, media player 330, and USB hub 332). Cover 313 may also provide protection for consumers from the power cables and electronic components contained within the door 310.

Each electronic display 18*d* has an outer housing 337 disposed directly against a surface of the mounting arm 314. One or more mounting arms 314 can supports each electronic display 18*d*. Each mounting arm 314 has an end 321*a* secured to a respective inner flange 360 of door frame 312. End 321 can be secured to inner flange 360 by using mechanical fasteners 320 such as bolts. In some implementations, a protective foam or flexible tape 331 can separate mounting arm 314 from panel assembly 311.

Figure 19:
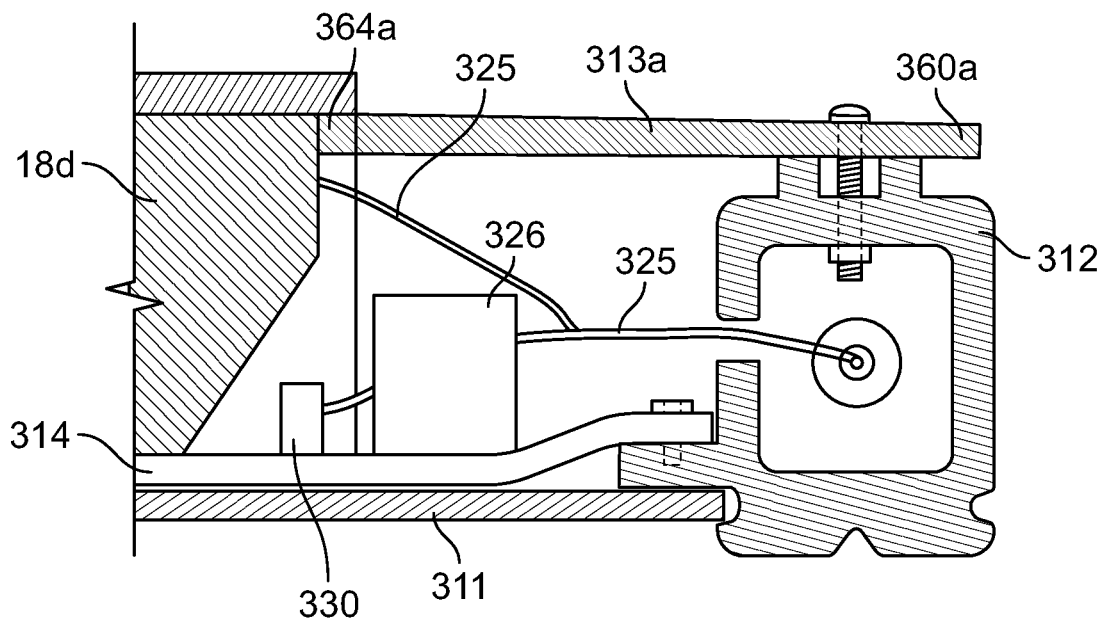
FIG. 19 is a cross-sectional view of the portion of the display case door shown in FIG. 18, according to a second exemplary embodiment.

FIG. 19 is a cross-sectional view of the portion of the display case door 310 in FIG. 18, according to a second exemplary embodiment. Cover 313a has a flange 360a secured to a front surface of frame rail 317 and an opposite end 364a extending away from flange 360a. Opposite end 364a is adjacent to a side edge of electronic displays 18d. Flange 360a is secured to the front surface of frame rail 317 by one or more mechanical fasteners.

Referring back to FIG. 15, mounting arms 314 and covers 313 allow electronic displays 18d to be quickly installed and removed for maintenance or replacement. To install an electronic display, a user can attach mounting arm 314 to a back surface of an electronic display 18d and, after positioning the electronic display in a desired position over the door, attach each end of the mounting arm 314 to frame 312. The user can then attach covers 313 to door frame 312 to cover the exposed surfaces of the panel assembly 311 and the mounting arms 314.

To replace an electronic display, a user can detach covers 313 from door frame 312 and remove mounting arms 314 from door frame 312. The user can remove electronic display 18d from mounting arm 314 and mount a new electronic display to arm 314. A user installs the new electronic display by attaching each end of the mounting arm 314 to frame 312 and then attaching covers 313 to door frame 312.

Figure 20:
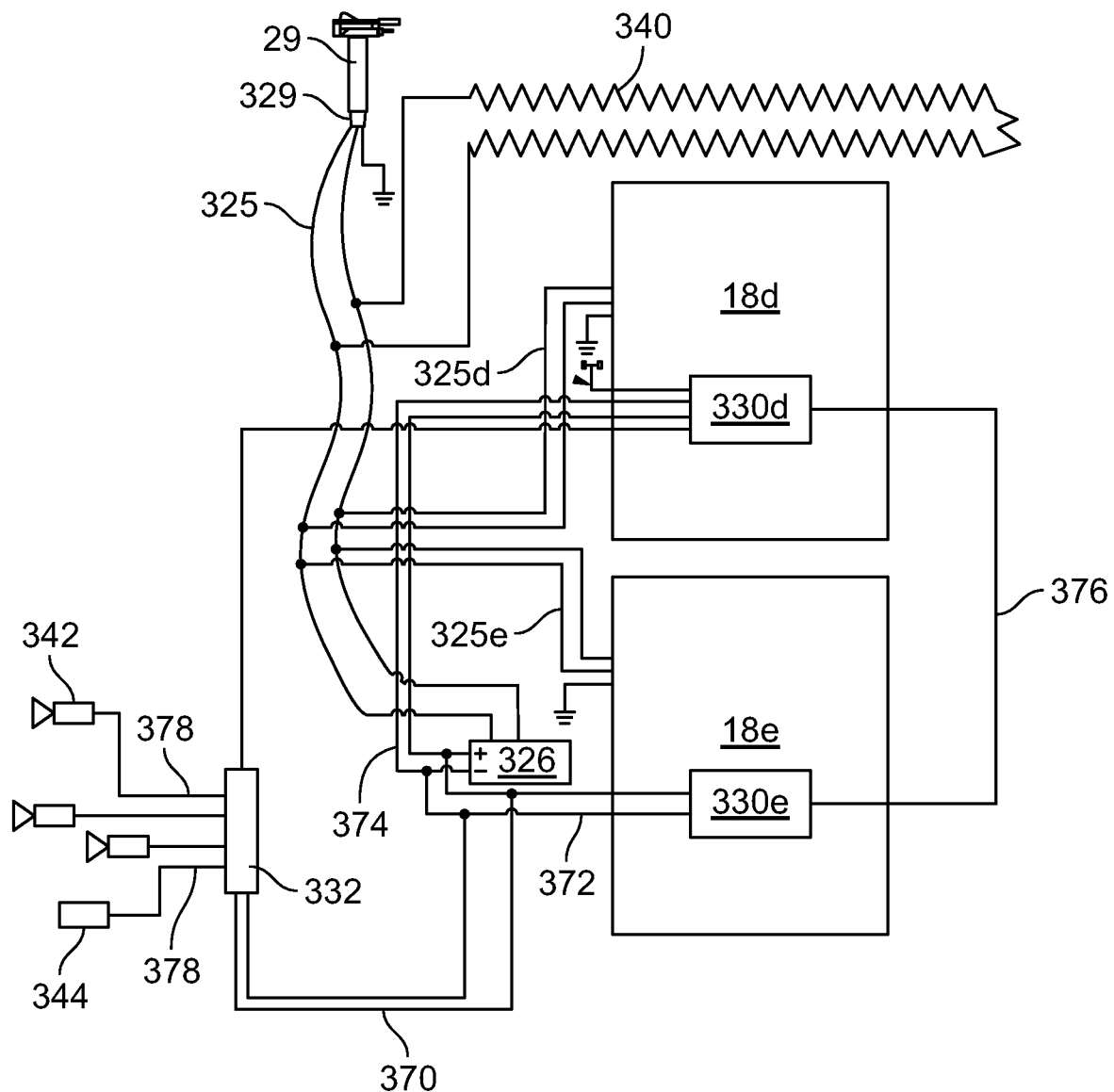
FIG. 20 is an electrical diagram of a display case door assembly according to implementations of the present disclosure.

FIG. 20 is an electrical diagram of a display case door assembly according to implementations of the present disclosure. Electrical hinge 29 has an electrical connector 329 (e.g., electrical plug) to which power cable 325 is electrically connected. Power cable 32 provides AC power to a door heater 340, a first electronic display 18d, a second electronic display 18e, and a power converter 326. Door heater 340 can include an anti-condensation system that has an electro-conductive coating to heat the display case door. Two power cables 325d and 325e branch out from power cable 325 to provide power to respective electronic displays 18d and 18e. Power converter 326 includes a rectifier (not shown) configured to change AC voltage to DC voltage, and a transformer (not shown) configured to decrease the voltage provided by power cable 325.

Power converter 326 is electrically connected to power hub 332 (e.g., USB power hub) by a power cable 370. Power converter 326 provides DC power to power hub 332. Power hub 332 is electrically connected to and provides power to one or more cameras 342 and to one or more touchscreen devices 344. The power cables 378 that connect cameras 342 and touchscreen devices 344 to power hub 332 can be USB power cords. Cameras 342 can be attached to the door handle or the door frame 312 to detect a customer in front of or near the display case door. Power hub 332 can also provide power to lights (e.g., LED lights) or other electronic devices included in the display case door.

In addition, power converter 326 is electrically connected to respective media players 330d and 330e. A first media player 330d is affixed to or built into first electronic display 18d and a second media player 330e is affixed to or built into second electronic display 18e. Each media player is in data communication with its respective electronic display. Power converter 326 is connected to each media player by respective power cables 372 and 374 that provide DC power to the media players. Media players 330d and 330e can be communicatively connected by a cable 376.

Figure 21:
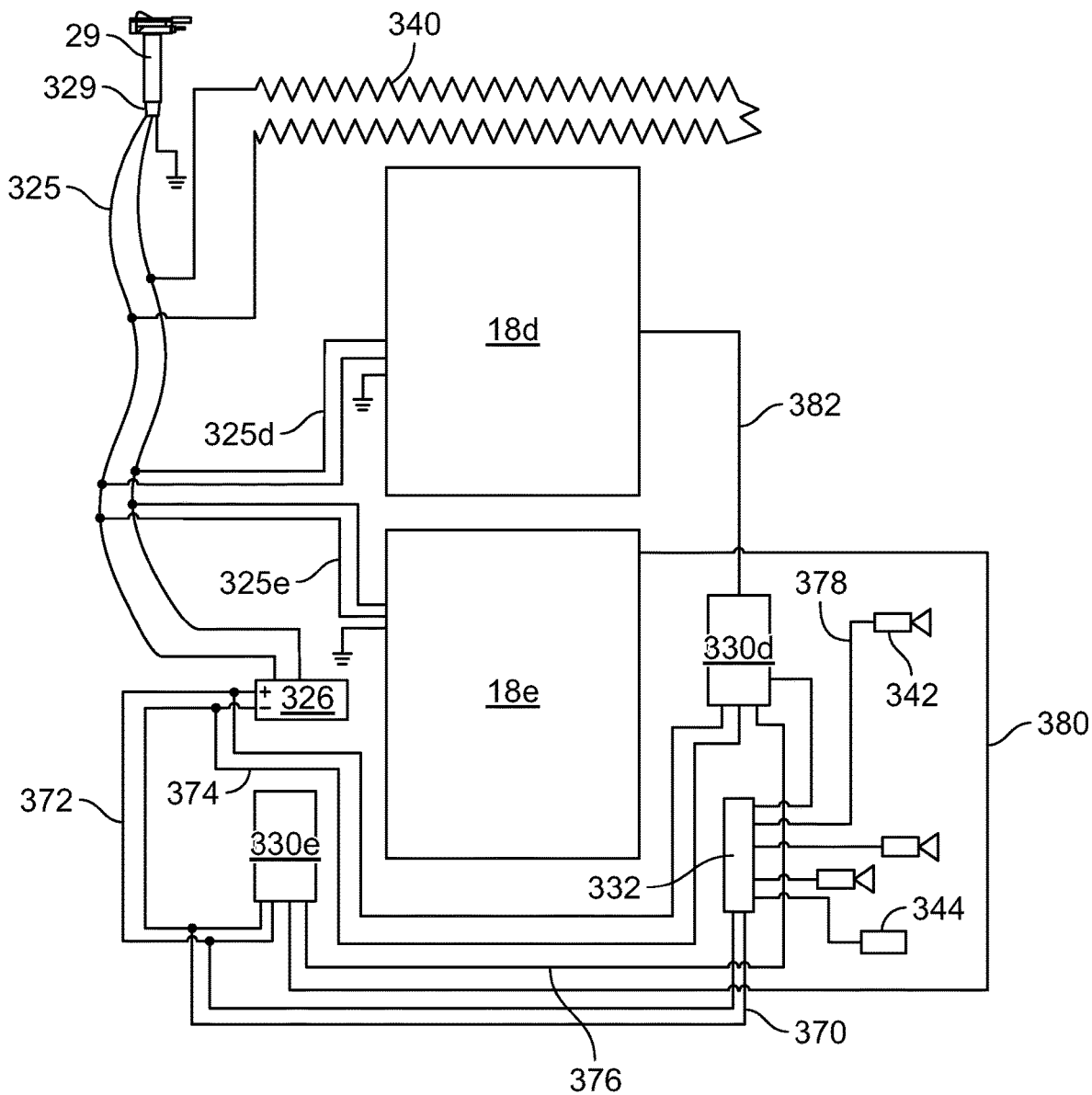
FIG. 21 is an electrical diagram of a display case door assembly according to implementations of the present disclosure.

FIG. 21 is an electrical diagram of a display case door assembly according to a second exemplary embodiment. The electrical diagram in FIG. 21 is similar to the electrical diagram in FIG. 20, with the main exception being that media players 330d and 330e are external to electronic displays 18d and 18e. Power converter 326 is electrically connected to external media players 330d and 330e by power cables 372 and 374. The media players can be disposed inside the display case door (e.g., between the panel assembly 311 and the cover 313) or they can be disposed outside the display case door. Each media player 330d and 330e is communicatively connected to respective electronic displays 18d and 18e by cables 380 and 382. The media players are communicatively connected to one another by cable 376. Power converter 326 is electrically connected to power hub 332 by power cable 370. Power hub 332 provides DC power to electronic devices such as cameras 342 and touchscreen devices 344.

Figure 22:
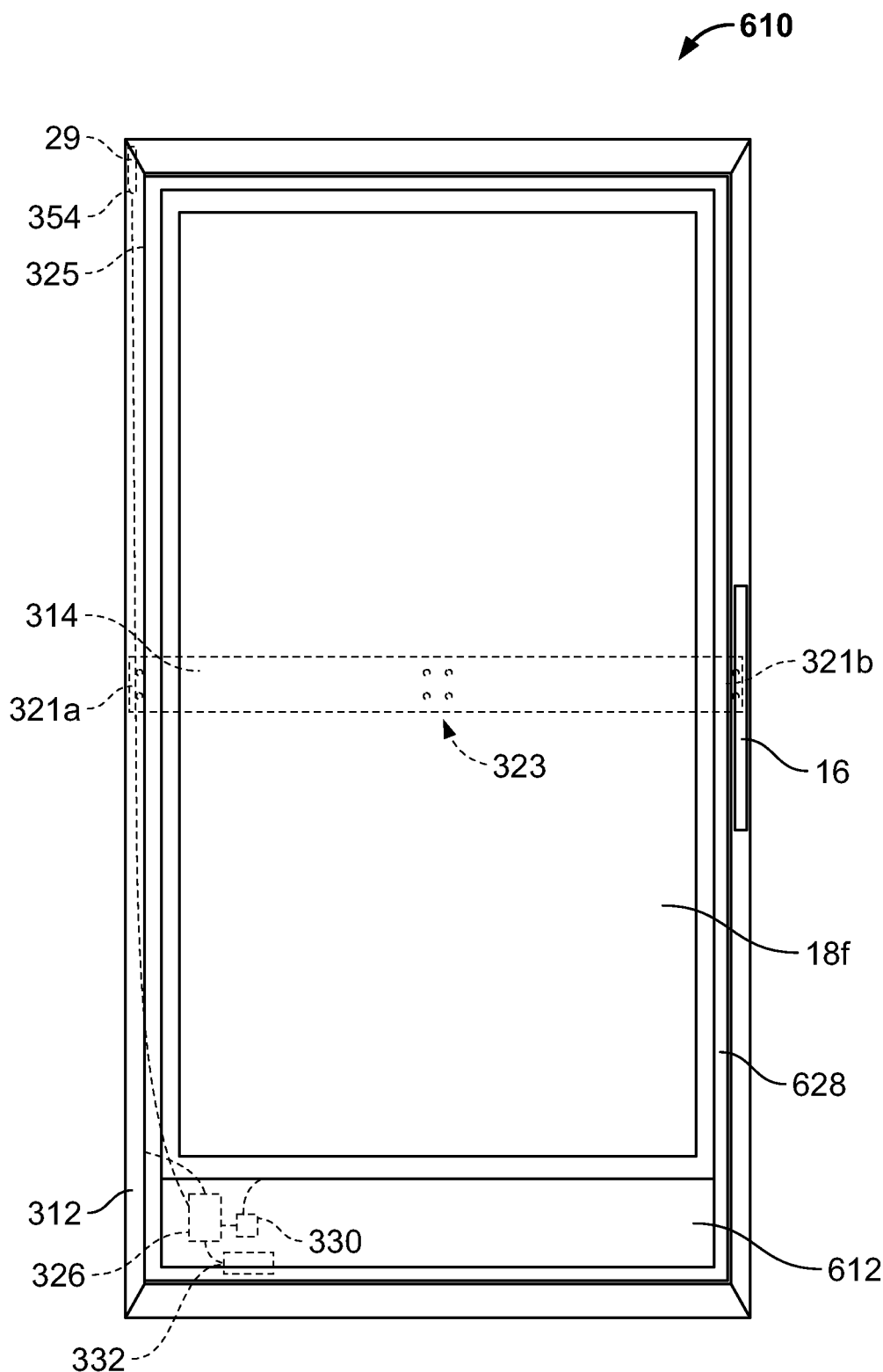
FIG. 22 is a front view of another exemplary display case door according to implementations of the present disclosure.

FIG. 22 shows a front view of a display case door 610 with a single electronic display 18f. The display 18f has a width that covers substantially all the panel assembly 311. In other words, electronic display 18f is as wide as the interior width of the frame 312. Electronic display 18f has a height that is less than the interior height of the frame 312, leaving a space 612 between the bottom frame member and the bottom edge of the electronic display 18f to place electrical components with door 610. For example, media player 330, power hub 332, and power converter 326 can be positioned below electronic display 18f in the space between the display 18f and the lower frame member.

Figure 23B:
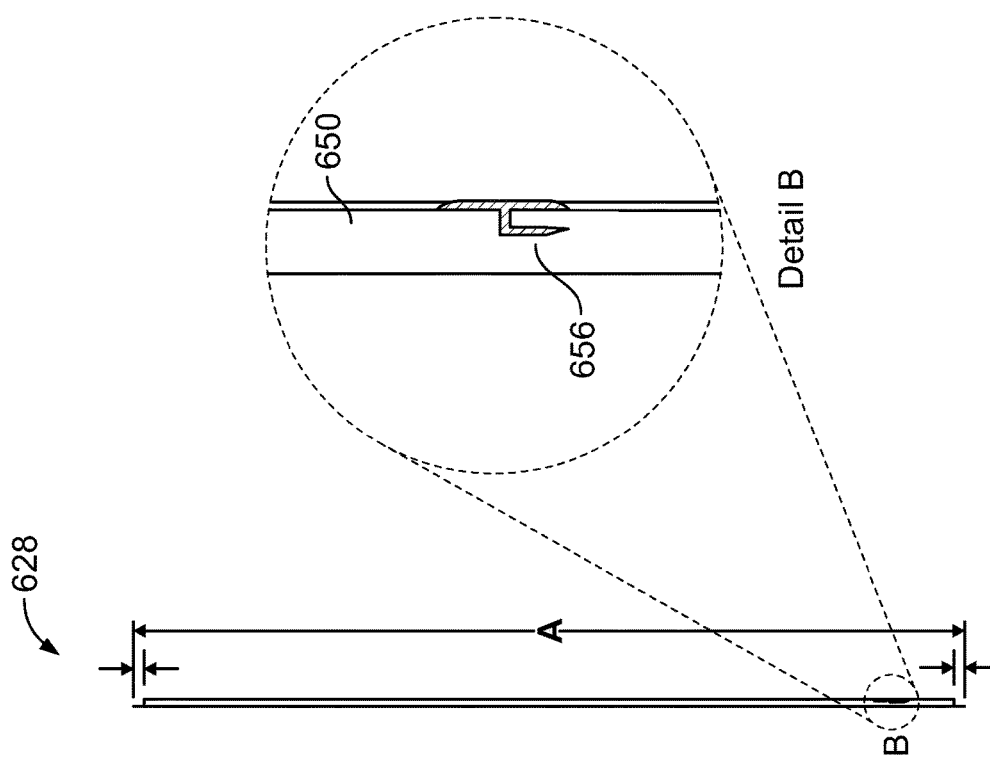
FIG. 23B is a cross-section view of the bezel cover shown in FIG. 23A.
Figure 23A:
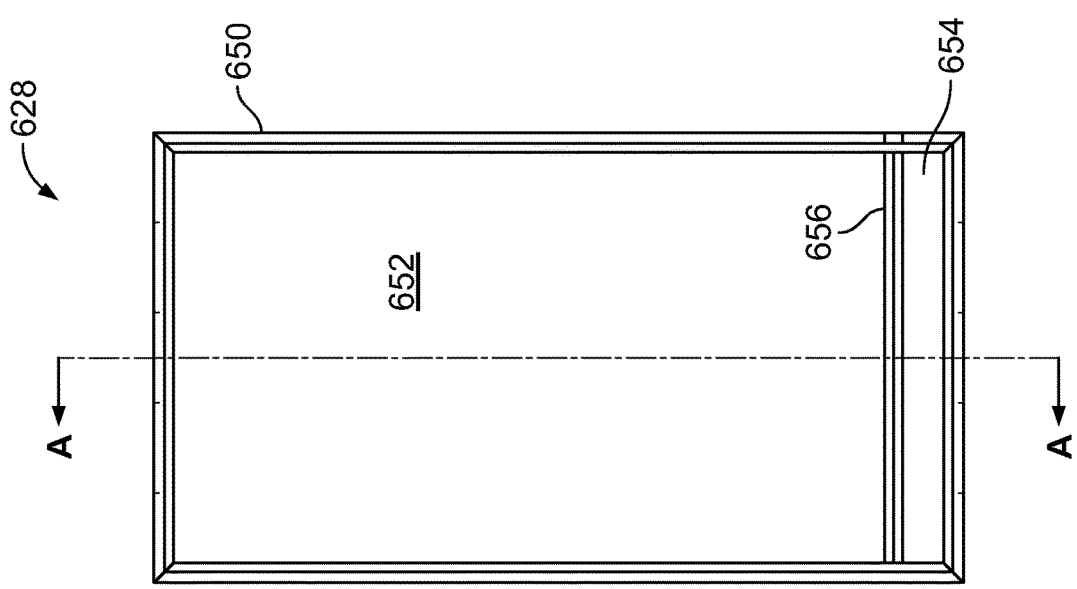
FIG. 23A is a front view of an exemplary bezel cover according to implementations of the present disclosure.

Display case door 610 includes a bezel cover 628. With reference to FIGS. 22, 23A, and 23B, Bezel cover 628 includes a metal or stiff plastic frame 650, a transparent cover 652, and an opaque cover 654. Transparent cover 652 is mounted to the frame 650. Transparent cover 652 is positioned over the electronic display 18f For example, transparent cover 652 can protect the display from damage. Transparent cover 652 can be made of plastic or glass. The opaque cover 654 is mounted to the frame 650. Opaque cover 654 is positioned over the space 612 between the electronic display 18f and the bottom frame member of the door 610. In some examples, bezel cover 628 includes a crossbar 656 mounted across a width of the frame 650. Crossbar 656 can positioned along the bezel cover frame 650 so as to be positioned at or near the bottom edge of the electronic display 18f when the bezel cover 628 is mounted to door 610. Crossbar 656 can serve as a mounting structure for an edge (e.g., the lower edge) of the transparent cover 652, an edge (e.g., the upper edge) of the opaque cover 654, or both.

Figure 24:
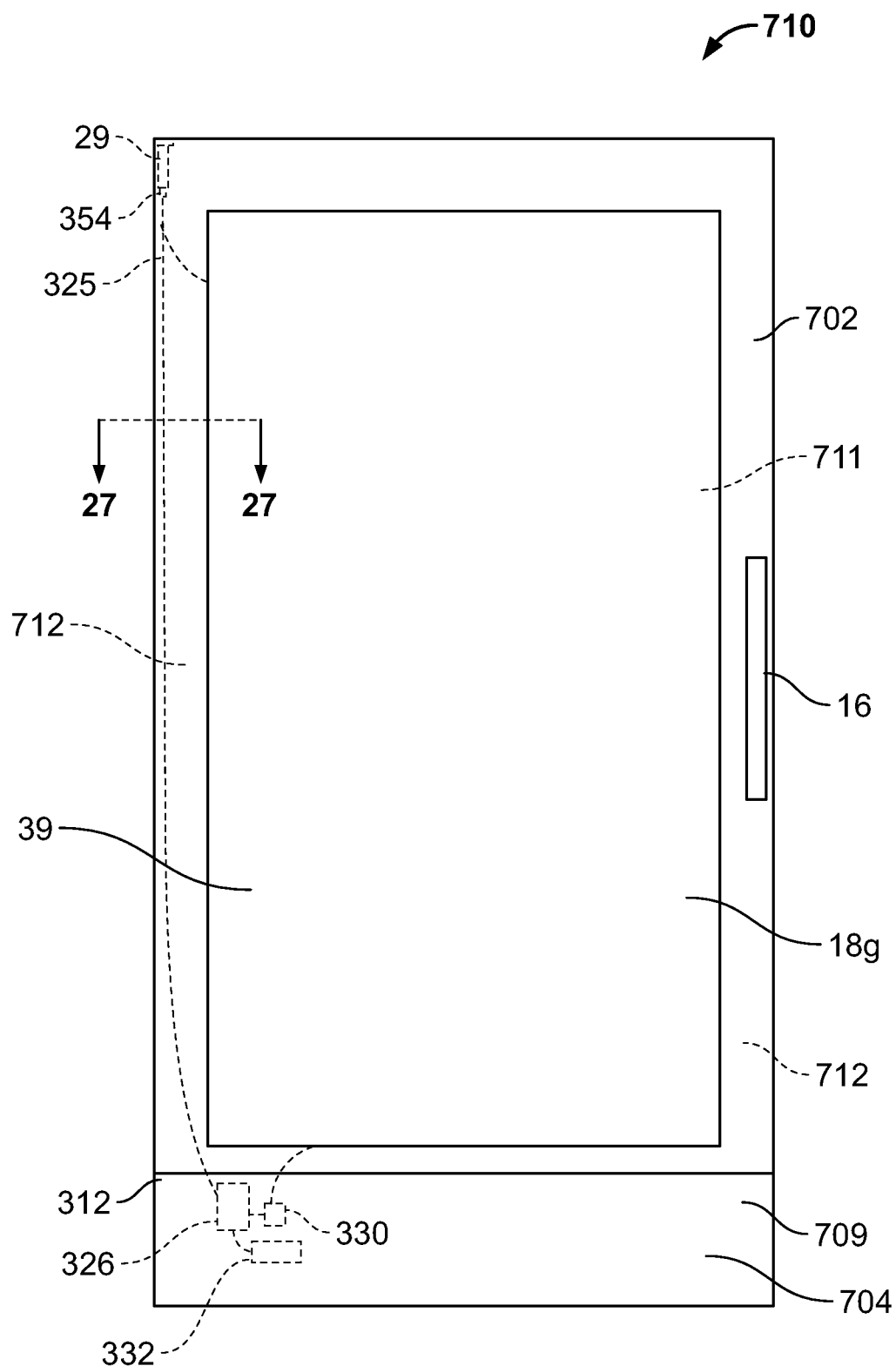
FIG. 24 is a front view of another exemplary display case door according to implementations of the present disclosure.

FIG. 24 illustrates an exemplary display case door 710 according to another embodiment. Display case door 710 includes an insulated panel assembly 711 (e.g., a transparent panel assembly) similar to the transparent panel assembly of FIGS. 1, 14, and 22. Display case door 710 also includes a door frame 712 configured to receive and secure an electronic display to the door. Similar to the display case door of FIG. 22, display case door 710 has a single electronic display 18g overlaying the panel assembly 711. For example, the electronic display 18g can be sized to fit the interior width of the frame 712, covering substantially all the panel assembly 711 along its width. In some implementations, electronic display 18g substantially overlays the panel assembly 711 to cover a majority of the panel assembly. For example, the electronic display 18g can cover more than 50% of the front surface area of the panel assembly 711, such as 80% or more. For example, electronic display 18g has a height that is less than the interior height of the frame 712, leaving a space 709 between the bottom of the door 710 and the bottom edge of the electronic display 18g to place electrical components with door 710. For example, media player 330, power hub 332, and power converter 326 can be positioned below electronic display 18g in the space between the display 18g and the lower frame member (shown in FIG. 25).

The door frame 712, the electronic display 18g, and the electrical components are covered by respective covers 702 and 704 such as opaque bezel covers. For example, a first door-sized bezel cover 702 is attached to door frame 712 and extends from an outer edge of the frame to an interior edge of a housing of the electronic displays 18g, exposing only the display screen 39 of the electronic display. A second bezel cover 704 is attached to a bottom surface of the door frame 712 or of the first bezel cover 702 to cover the electrical components.

Electronic display 18g is releasably secured or coupled to the door frame 712. FIGS. 27-33 (which are discussed in detail below) illustrate several exemplary implementations of releasable electronic display mounts including, but not limited to: mechanical fasteners extending from the door frame 712 into a housing of the electronic display (FIG. 32), mounting brackets attached to the housing of the electronic display (FIG. 33), and a display retainer 714 (e.g., a mounting bezel) secured to the door frame 712 and having a coupling end that extends over an edge of the electronic display 18g to releasably secure the electronic display to the door frame (FIGS. 27-31).

Display case door 710 includes a power cable 325 that extends from an electrical connector 354 (e.g., 120V electrical plug) that is part of an electrical hinge 29. Power cable 29 is disposed within a channel in a portion of door frame 712. Power cable 325 is connected to and provides power to the power converter 326 and to the electronic display 18g.

Figure 25:
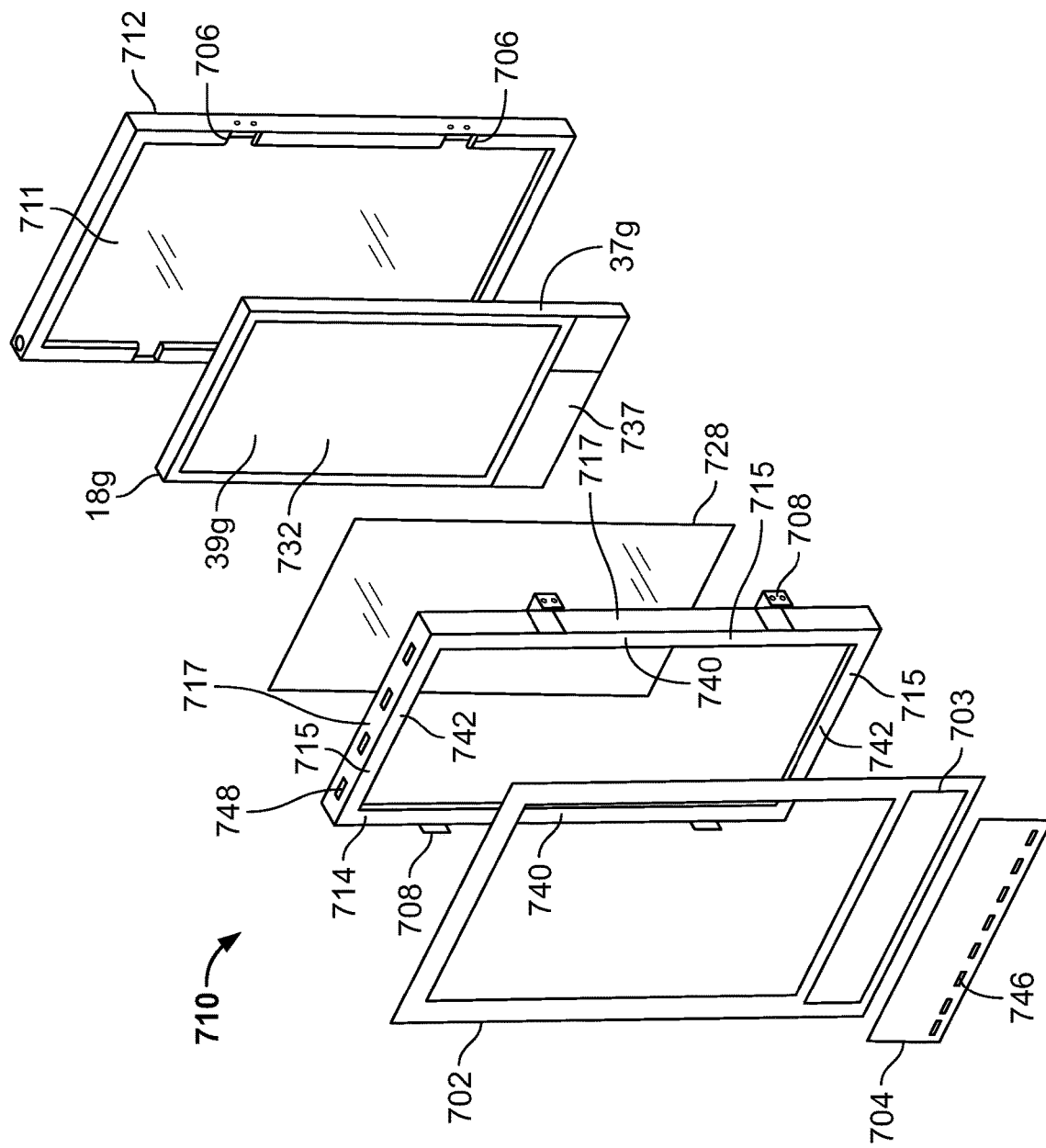
FIG. 25 is an exploded view of the display case door shown in FIG. 24.

FIG. 25 is an exploded view of an exemplary implementation of a display case door 710. Electronic display 18g has an outer housing 37g and a display panel 39g (e.g., a screen) mounted to outer housing 37g. Electronic display 18g can be positioned directly against the front surface of the insulated panel assembly 711, or a protecting foam or flexible tape can be positioned between the back surface of electronic display 18g and the front surface of panel assembly 711. Electronic display 18g can include, but is not limited to, a liquid crystal display (LCD), a light emitting diode (LED) display, an organic light emitting diode (OLED) display, a field emission display (FED), a plasma display panel (PDP), or an electroluminescent (EL) display. For example, electronic display 18g can be a smart television with streaming capabilities for receiving content over a wireless network (e.g., a Wi-Fi network). Electronic display 18g substantially covers panel assembly 711. For example, the display covers more than 50% of the panel assembly. Electronic display 18g, together with the circuitry module 737, overlay the panel assembly 711 to cover substantially the entire surface area of the panel assembly 711. The surface area of the panel assembly 711 is the front surface area of the panel assembly that is not covered by the door frame 712.

Display case door 710 includes a transparent protective panel 728 positioned between a front surface 732 of the electronic display 18g and a coupling end 715 of a mounting bezel 714 type of display mount. Protective panel 728 is similar to the transparent cover of FIG. 14 in that is a protective cover that overlaps the front surface 732 of electronic display 18g to protect it, for example, from a consumer bumping the display door 710 with a shopping cart. In some examples, the transparent cover 728 can be attached to housing 37g or an inner surface of the coupling end 715 using adhesive or mechanical fasteners. Transparent covers 728 can be made of hard plastic or glass.

The mounting bezel 714 of display case door 710 features two parallel, vertical members 740 that have a generally L-shaped cross-section (shown in FIG. 27) and that are separated by two horizontal members 742 that extend from ends of the vertical members 740. Horizontal members 742 also have a generally L-shape cross-section. The coupling end 715 of mounting bezel 714 can be flange that extends generally parallel to the panel assembly 711. Mounting bezel 714 has mounting brackets 708 attached to a side of the mounting bezel. Brackets 708 are configured to secure the mounting bezel 714 to the door frame 712. For example, each mounting bracket 708 has a first end affixed to mounting bezel 714 and a second end, extending away from the first end, configured to interface with the door frame 712 at a respective mounting site 706 of the door frame 712 to secure the mounting bezel 714 to the door frame 712. As the mounting bezel 714 is secured to the door frame 712, the coupling end 715 holds the electronic display 18g, through the protective panel 728, secured in place by retaining the display against the panel assembly 711. Thus, the coupling end 715 of each vertical member 740 and the coupling end 715 of the top horizontal member 742 extend over an edge of the electronic display 18g to cover three edges (e.g., side edges and top edge) of the housing 37g of the electronic display. Mounting bezel 714 can optionally include multiple louvers 748 configured to provide cooling air-flow to the display 18g and electronics.

Display case door 710 includes two covers 702 and 704 that, when secured to the door frame 712, cover the door frame and the mounting bezel 714. As discussed in detail above with respect to FIG. 24, the covers 702 and 704 can be bezel covers made of an opaque material. The first bezel cover 702 is sized to overlay the front surface of the door frame 712 and the coupling end 715 (e.g., a coupling flange) of the mounting bezel 714. The second bezel cover 704 is a rectangular cover that can be attached to the door frame or to the first bezel cover 702 to cover the circuitry module 737 disposed under the electronic display 18g. The cover bezels can be attached to the door frame with mechanical fasteners, adhesive, or a similar method. Circuitry module 737 includes the media player, power hub, and power converter referred to in FIG. 24. Circuitry module 737 overlays a portion of the panel assembly 711. The circuitry module 737 is releasably coupled to door frame 712. For example, when installed, module 737 can be removed through an opening 703 of the first cover bezel 702. Circuitry module 737 includes at least a media player (see FIG. 24) in electronic communication with electronic display 18g. The media player is configured to control media content presented on display. Second bezel cover 704 covers the circuitry module 737 and can include multiple louvers 746 configured to provide cooling air-flow to the media player.

Figure 26A:
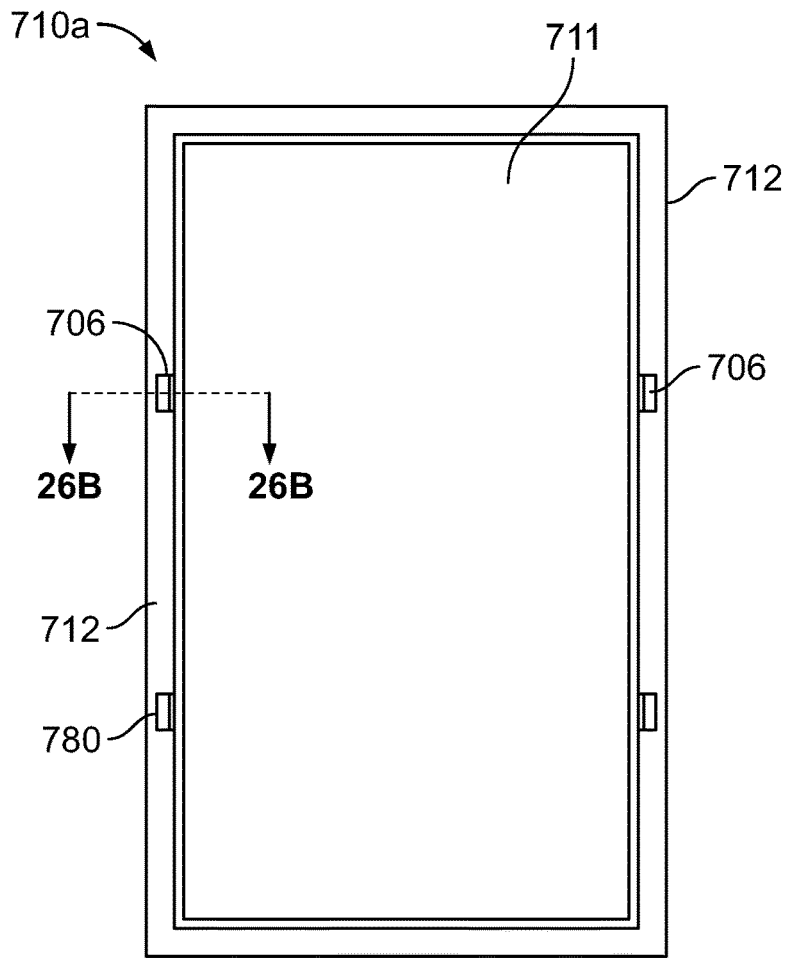
FIG. 26A is a front view of another exemplary display case door according to implementations of the present disclosure.
Figure 26B:
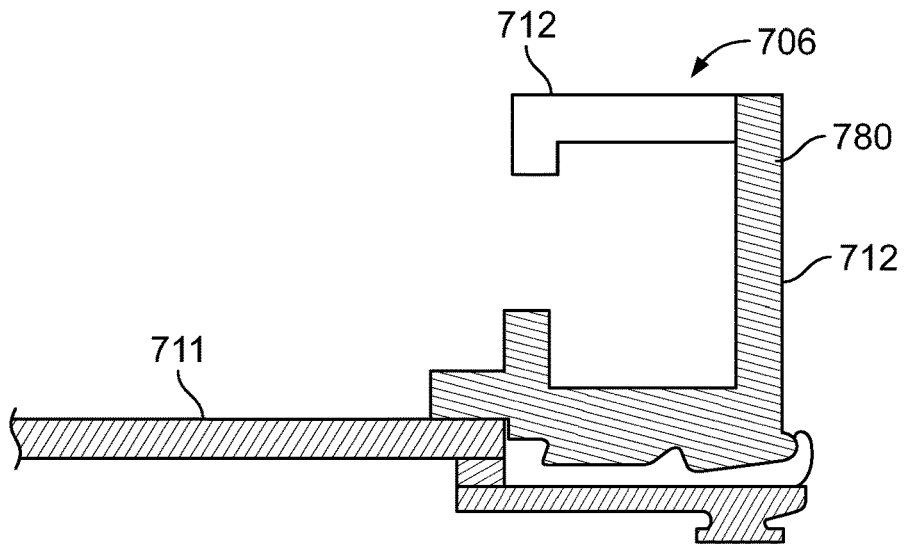
FIG. 26B is a cross-sectional view of a portion of the display case door shown in FIG. 26A, taken along line 26B-26B in FIG. 26A.

FIG. 26A is a front view of an exemplary display case door 710a without mounted electronic displays. Display case door 710a has a panel assembly 711 and a door frame 712 secured to and extending about a perimeter of panel 711. Door frame 712 is configured to support an electronic display mounted thereto. For example, referring also to FIG. 26B, the door frame 712 includes a portion 780 that extends outwards a distance beyond a front surface of the panel assembly 711, and a plurality of mounting sites 706 arranged along the frame 712. The mounting sites 706 are configured to interface with a display mounting retainer (e.g., with a bracket of a mounting bezel 714) such that, when mounted, the display (shown in FIG. 24) overlays the panel assembly. Mounting sites 706 can include open slot cuts of a front surface of the door frame 712 that allow a user to insert a tool to fasten a mechanical fastener used to attach the mounting bezel to the door frame 712.

As further described in detail below with respect to FIGS. 27-35, the distance that the portion 780 of the door frame 712 extends outward beyond the front surface of panel assembly 711 can correspond to a thickness of the electronic display and a thickness of the transparent protective panel 728, such that, when mounted, a front surface of the protective panel is substantially flush with a front surface of the door frame. In some implementations, the distance that the portion 780 of the door frame 712 extends outward beyond the front surface of panel assembly 711 corresponds to a thickness of the electronic display, such that, when mounted, a front surface of the electronic display is substantially flush with a front surface of the door frame.

Figure 27:
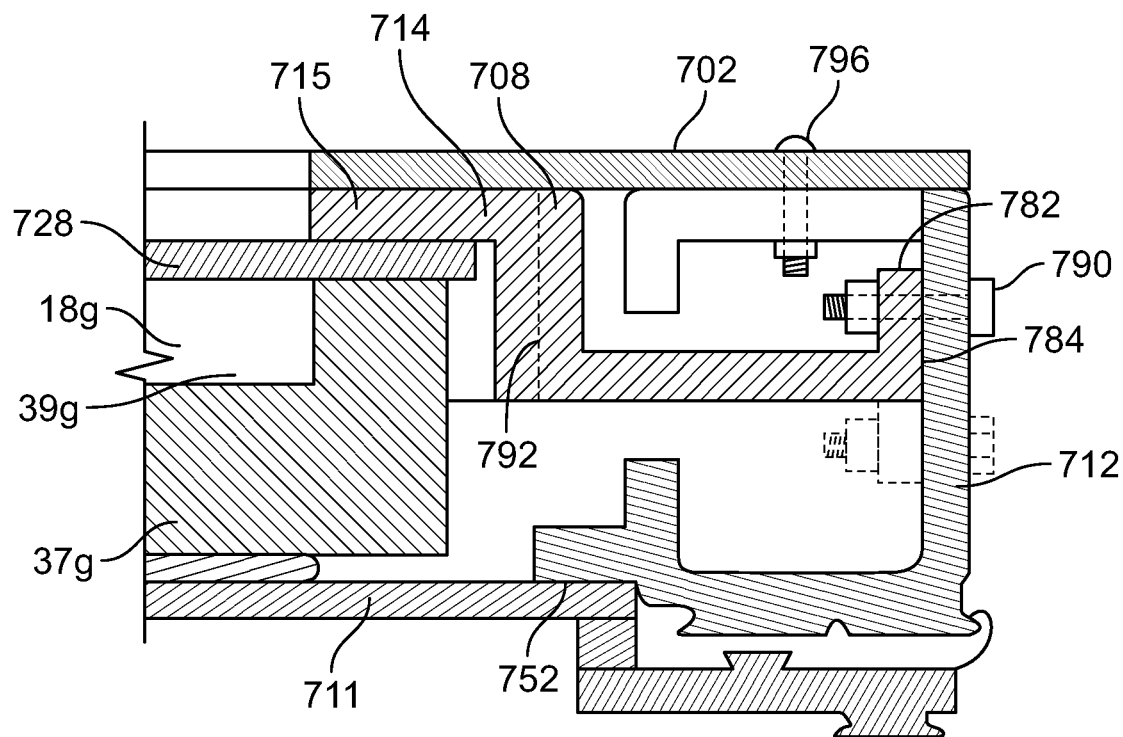
FIG. 27 is a cross-sectional view of a portion of the display case door shown in FIG. 24, taken along line 27-27 in FIG. 24.

FIG. 27 is a cross-sectional view of a portion of the display case door shown in FIG. 24, taken along line 27-27. For clarity, the power cable and the bottom part of the door frame 712 are not shown. Frame 712 includes a channel 752 into which panel 711 is secured. Panel 711 can be bonded to frame 712 within channel 752 with an adhesive, such as an epoxy or polyurethane. Mounting bracket 708 is affixed to mounting bezel 714, e.g., mounting bracket 708 can be welded to mounting bezel 714. The interface between the mounting bracket and the mounting bezel is shown with a dashed line 792. Mounting bracket 708 has a U-shape cross-section. In some implementations, mounting bracket 708 is made of metal or a hard plastic. In some implementations, mounting bracket 708 and mounting bezel 714 are one piece, such that the mounting bezel or display retainer 714 has a coupling end 715 that mates with the electronic display (e.g., through the protective panel 728) and a second end 782 that includes a mounting interface 784 that is secured to an inner surface of door frame 12 by a mechanical fastener 790. Coupling end 715 can be a flange that extends substantially parallel (e.g., within general engineering tolerances within the industry) to panel assembly 711 to releasably secure protective panel 728 and electronic display 18g to the door frame 712. Bezel cover 702 is secured to a front surface of door frame 712 by a mechanical fastener 796. Bezel cover 702 extends from an outer edge of door frame 712 to the edge of the coupling end 715 to cover the door frame 712, the mounting bracket 708, and the mounting bezel 714. Additionally, the outer housing 37g of electronic display 18g can be covered by coupling end 715 such that only the display screen 39g is visible to a customer standing in front of the display case door. In some cases, mounting bracket 708 can have a generally S-shaped cross-section, with the second end 782 extending in the opposite direction (shown with dashed lines). The door handle (not shown) can be attached to a surface of the bezel cover 702 or to a surface of the door frame.

Figure 28:
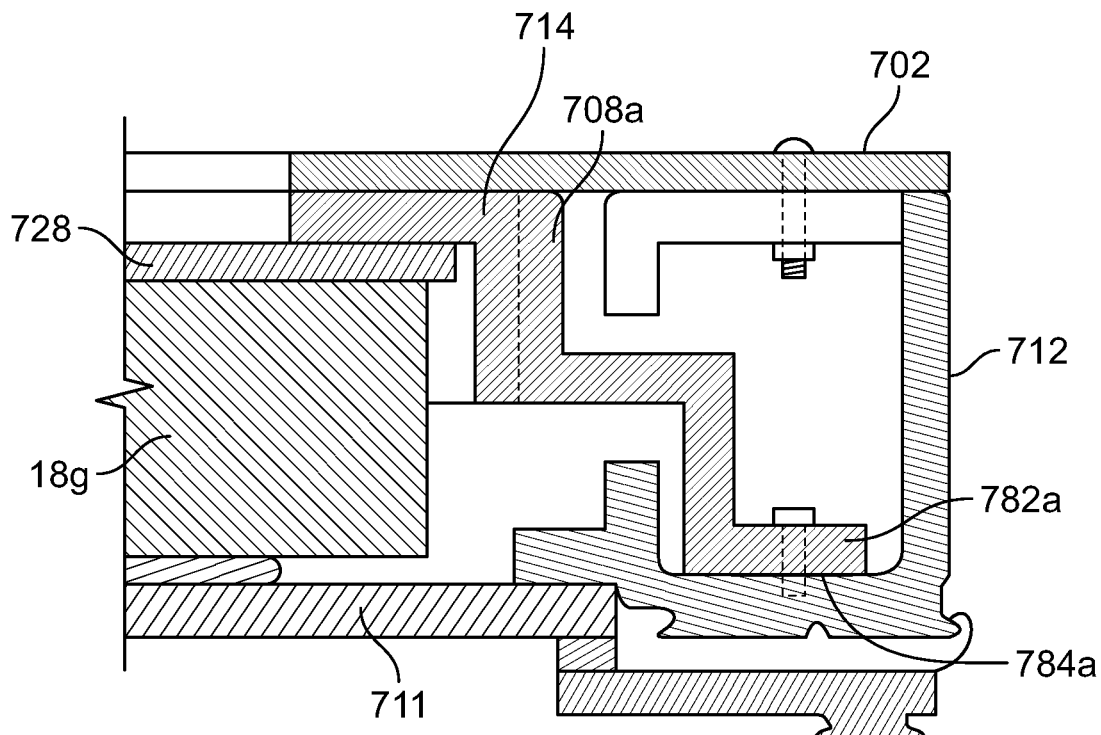
FIG. 28 is a cross-sectional view of the portion of the display case door shown in FIG. 27, according to a second exemplary embodiment.

FIG. 28 is a cross-sectional view of the portion of the display case door shown in FIG. 24, taken along line 27-27. FIG. 28 illustrates a second exemplary mounting bracket configuration. Though not shown in FIGS. 28-33, it would be understood that display 18g includes a housing and a display screen as shown in FIG. 27, with the edge of the housing being covered by the coupling end 715, and/or the bezel cover 702. As illustrated in FIG. 28, mounting bracket 708a can have a generally M-shaped cross-section with one end affixed to mounting bezel 714 and a second end 782a having a coupling interface 784a that is secured to a back, inner surface of the door frame 712 by a mechanical fastener.

Figure 29:
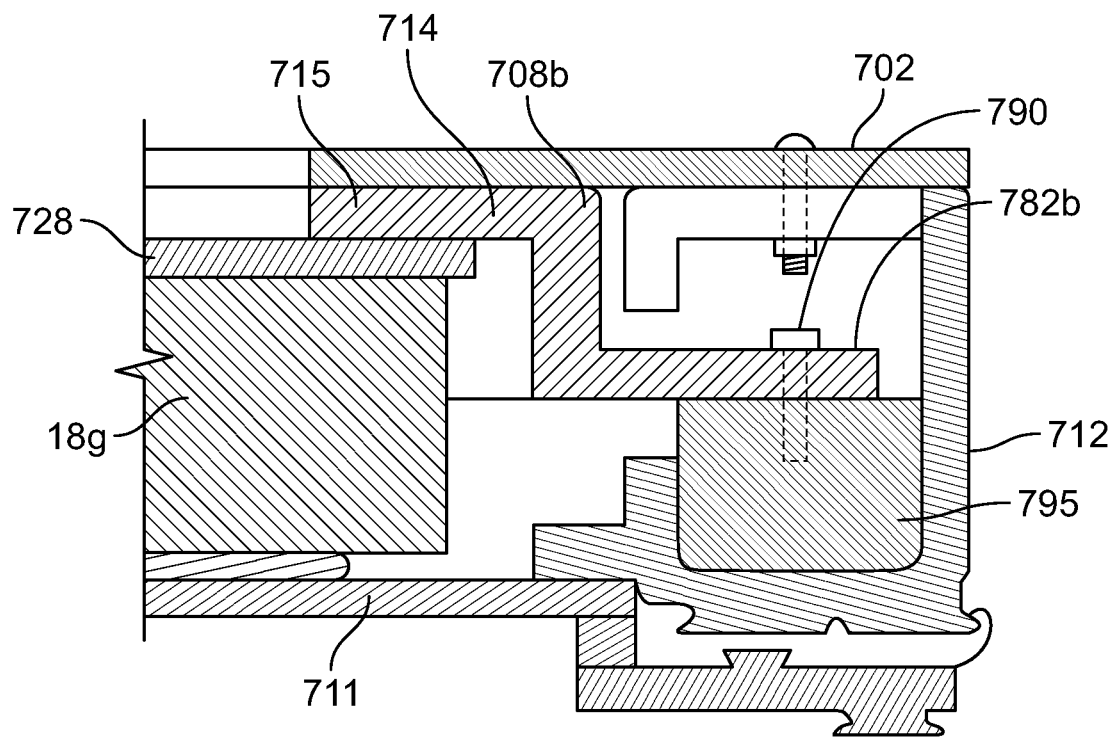
FIG. 29 is a cross-sectional view of the portion of the display case door shown in FIG. 27, according to a third exemplary embodiment.

FIG. 29 is a cross-sectional view of the portion of the display case door shown in FIG. 24, taken along line 27-27.

FIG. 29 illustrates a third exemplary mounting bracket configuration. Mounting bracket 708b has a generally L-shaped cross-section that, together with mounting bezel 714, form an S-shape cross-section with coupling end 715 securing the display to the door frame, and the second end 782b secured to a block 795 such as a cast block disposed inside the frame channel of door frame 712.

Figure 30:
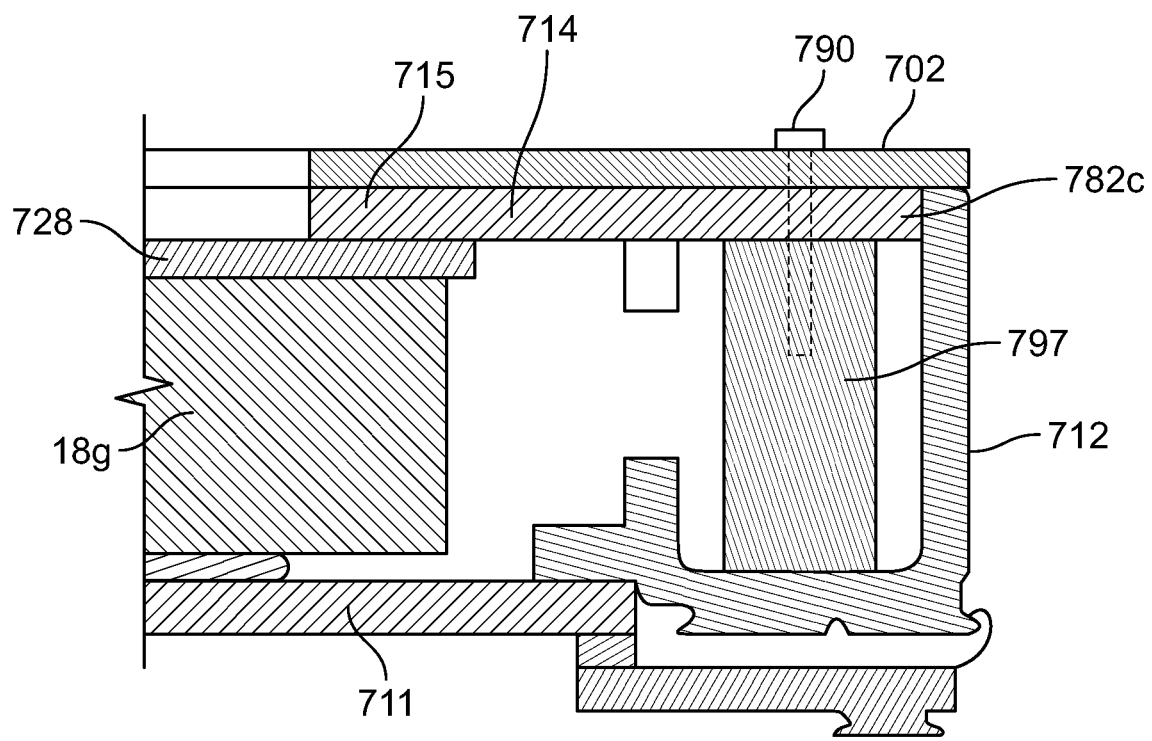
FIG. 30 is a cross-sectional view of the portion of the display case door shown in FIG. 27, according to a fourth exemplary embodiment.

FIG. 30 is a cross-sectional view of the portion of the display case door shown in FIG. 24, taken along line 27-27. FIG. 30 illustrates a fourth exemplary mounting bracket configuration. Instead of using a mounting bracket, the mounting bezel 714 can be a generally flat member with a coupling end 715 securing the display 18g to the door frame 712, and the second end 782c secured to a cast block by a mechanical fastener 790.

Figure 31:
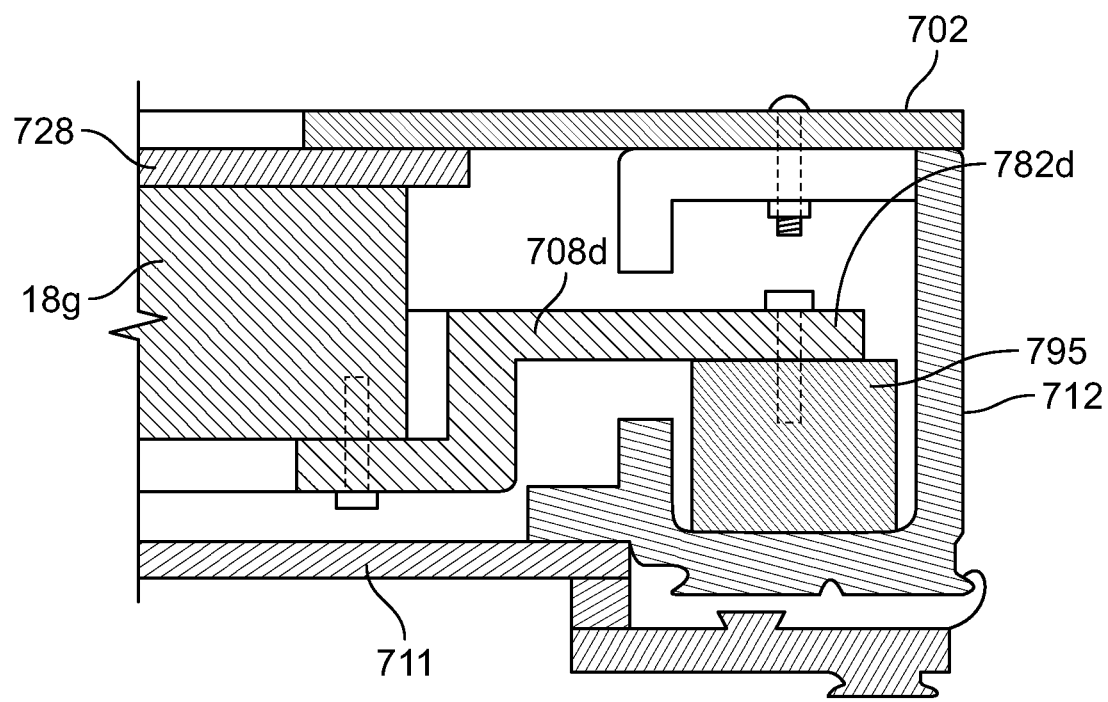
FIG. 31 is a cross-sectional view of the portion of the display case door shown in FIG. 27, according to a fifth exemplary embodiment.

FIG. 31 is a cross-sectional view of the portion of the display case door shown in FIG. 24, taken along line 27-27. FIG. 31 illustrates a fifth exemplary mounting bracket configuration. The display retainer has a generally S-shaped cross-section with a first end secured to a back surface of the electronic display and a second end 782d coupled to the door frame 712 or a cast block 795 of the door frame 712. The display retainer can be a mounting bracket 708d, a mounting bezel, or a combination of the two.

Figure 32:
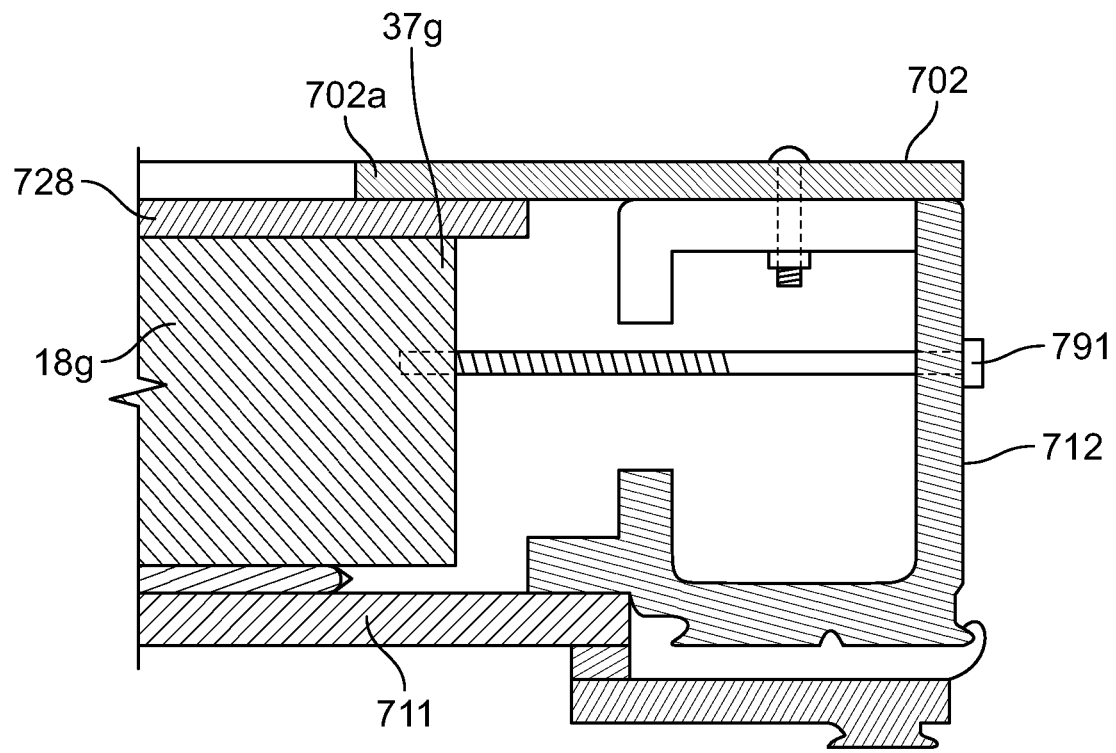
FIG. 32 is a cross-sectional view of the portion of the display case door shown in FIG. 27, according to a sixth exemplary embodiment.

FIG. 32 is a cross-sectional view of the portion of the display case door shown in FIG. 24, taken along line 27-27. FIG. 32 illustrates a sixth exemplary mounting bracket configuration. Instead of being mounted by a mounting bracket or a mounting bezel, electronic display 18g can be secured to door frame 712 by a fastener 791 such as a long mechanical fastener that extends from a side surface of the door frame 712 to a side edge of the housing of the display 18g.

Figure 33:
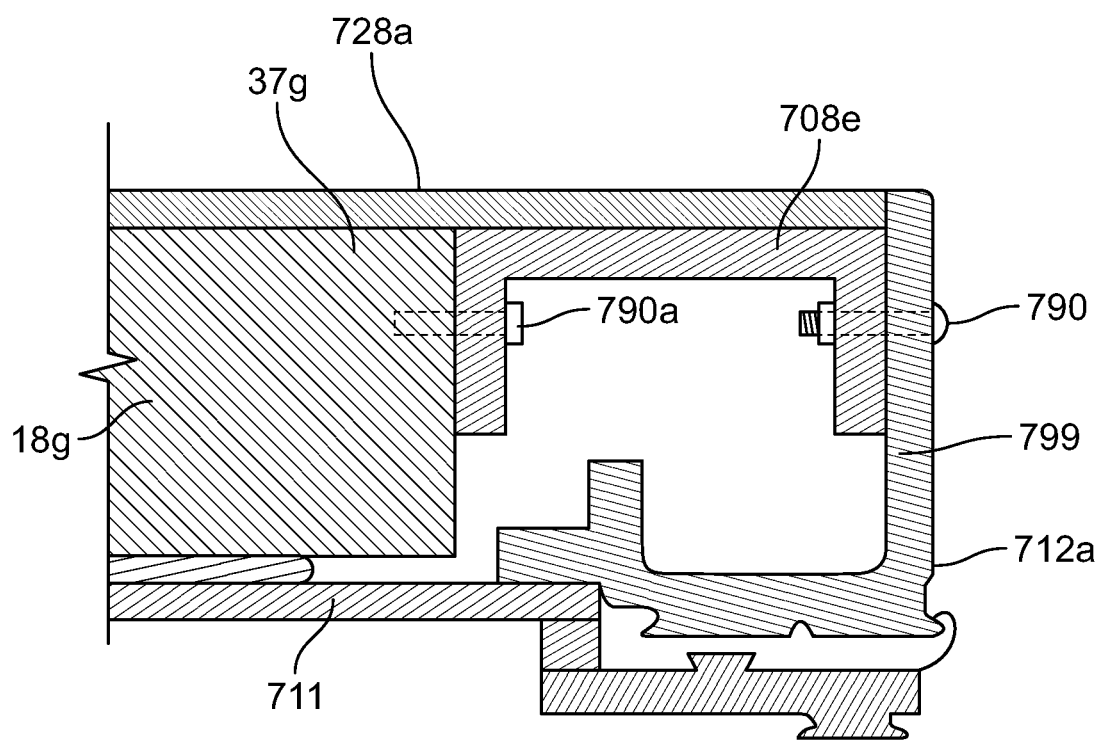
FIG. 33 is a cross-sectional view of the portion of the display case door shown in FIG. 27, according to a seventh exemplary embodiment.

FIG. 33 is a cross-sectional view of the portion of the display case door shown in FIG. 24, taken along line 27-27. FIG. 33 illustrates a seventh exemplary mounting bracket configuration. Door frame 712a can have a generally L-shaped cross-section with a mounting flange 799 extending outwardly, away from panel assembly 711 a distance slightly larger than a thickness of the electronic display 18g. Such distance can include a distance equivalent to a thickness of the display 18g plus a thickness of a transparent protective panel 728a. Protective panel 728a extends from on flange 799 of the door frame 712a, to the opposite flange of the door frame, across substantially the entire width of the display case door. The display retainer can be a mounting bezel or a bracket 708e having a U-shape cross-section, with a first end secured to a side of the housing of display 18g by a first mechanical fastener 790a, and a second end secured to flange 799 of door frame 712a. Mounting bracket 708e has a flat surface substantially flush with a front surface of the electronic display 18g. The transparent protective panel 728a can be secured (e.g., adhered) to the flat surface of the mounting bracket. Protective panel 728a can have an opaque border to cover bracket 708e. The door handle (not shown) can be adhered to the opaque border of the protective panel.

To install electronic display 18g, a user can first obtain a door having a panel assembly and a door frame configured to support an electronic display mounted thereto. The user can position the electronic display over a first portion of the panel assembly and attach at least one display retainer to the door frame. A retainer with a coupling end that mates with an edge of the electronic display, releasably secures the display to the door frame. The circuitry module overlaying a second portion of the panel assembly is secured to the door frame. The media player of the circuitry module is communicably coupled to the electronic display, and the circuitry module is attached to the door frame.

While a number of examples have been described for illustration purposes, the foregoing description is not intended to limit the scope of the invention, which is defined by the scope of the appended claims. There are and will be other examples and modifications within the scope of the following claims. Furthermore, one of skill in the art would appreciate that features described in reference to a specific embodiment are not limited to that embodiment and can be interchanged with features of other embodiments.

What is claimed is:

1. A display case door comprising:
an insulated panel assembly;
a door frame extending about and secured to a peripheral edge of the insulated panel assembly;
an electronic display external to the insulated panel assembly and mounted to the display case door, the electronic display overlaying the insulated panel assembly;
a mounting bezel secured to the door frame and having a coupling end that extends over an edge of the electronic display securing the electronic display to the door frame;
a transparent protective panel positioned between a front surface of the electronic display and the coupling end of the mounting bezel;
a first cover bezel coupled to a front surface of the door frame, the first cover bezel sized to overlay the front surface of the door frame and the coupling end of the mounting bezel;
a circuitry module positioned in a bottom portion of the door frame and overlaying a portion of the insulated panel assembly, the circuitry module releasably coupled to the door frame, and the circuitry module comprising a media player in electronic communication with the electronic display, the media player configured to control media content presented on the electronic display;
a power cable disposed within a channel defined by a portion of the door frame, the power cable electrically connected to the electronic display and to the media player, and a second bezel cover coupled to the door frame and covering the circuitry module, the second bezel cover comprising a plurality of louvres configured to provide cooling air-flow to the media player.

2. The display case door of claim 1, wherein the insulated panel assembly comprises an opaque insulating material.

3. The display case door of claim 1, wherein the insulated panel assembly comprises foam.

4. The display case door of claim 1, wherein the electronic display overlays the insulated panel assembly and overlaps more than 50% of a surface area of the insulated panel assembly.

5. The display case door of claim 1, wherein the electronic display and the circuitry module together overlay the insulated panel assembly to cover an entire surface area of the insulated panel assembly.

6. The display case door of claim 1, wherein the mounting bezel comprises two parallel, vertical members.

7. The display case door of claim 6, wherein the coupling end of the mounting bezel comprises a flange of each vertical member and a flange of at least one horizontal member, each respective flange extending generally parallel to the insulated panel assembly.

8. The display case door of claim 6, wherein a coupling end of each vertical member and a coupling end of one horizontal member extend over the edge of the electronic display overlapping three edges of a housing of the electronic display.

9. The display case door of claim 6, wherein each of the vertical members comprise at least one mounting bracket configured to secure the mounting bezel to the door frame.

10. A display case door comprising:
an insulated panel assembly;
a door frame extending about and secured to a peripheral edge of the insulated panel assembly;
an electronic display external to the insulated panel assembly and mounted to the display case door, the electronic display overlaying the insulated panel assembly;
a mounting bezel secured to the door frame and having a coupling end that extends over an edge of the electronic display securing the electronic display to the door frame; and
a cover bezel coupled to a front surface of the door frame, the cover bezel sized to overlay the front surface of the door frame and the coupling end of the mounting bezel.

11. The display case door of claim 10, wherein the insulated panel assembly comprises an opaque insulating material.

12. The display case door of claim 10, wherein the insulated panel assembly comprises a foam panel.

13. The display case door of claim 10, wherein the electronic display overlays a majority of the insulated panel assembly.

14. The display case door of claim 10, further comprising a transparent protective panel positioned between a front surface of the electronic display and the coupling end of the mounting bezel.

15. The display case door of claim 10, further comprising a circuitry module positioned in a bottom portion of the door frame and overlaying a portion of the insulated panel assembly, the circuitry module releasably coupled to the door frame, and the circuitry module comprising a media player in electronic communication with the electronic display, the media player configured to control media content presented on the electronic display.

16. The display case door of claim 15, further comprising a second cover bezel coupled to the door frame and covering the circuitry module.

17. The display case door of claim 16, wherein the second cover bezel comprises a plurality of louvers configured to provide cooling air-flow to the media player.

18. A display case door comprising:
an insulated panel assembly; and
a door frame extending about and secured to a peripheral edge of the insulated panel assembly, the door frame being configured to support an electronic display mounted externally to the insulated panel assembly, the door frame comprising:
a portion that extends outwards a distance beyond a front surface of the insulated panel assembly, and
a plurality of mounting sites arranged along the portion of the door frame and configured to interface with a display mounting retainer,
wherein, when mounted, the electronic display overlays the insulated panel assembly, and
wherein the distance corresponds to a thickness of the electronic display such that, when mounted, a front surface of the electronic display is substantially flush with a front surface of the door frame.

19. The display case door of claim 18, wherein the insulated panel assembly comprises an opaque insulating material.

20. The display case door of claim 18, wherein the display mounting retainer comprises a mounting bezel secured to the door frame and having a coupling end that is arranged to extend over an edge of the electronic display to releasably secure the electronic display to the door frame, and
wherein the display case door further comprises:
a transparent protective panel configured to be positioned between a front surface of the electronic display and the coupling end of the mounting bezel; and
a cover bezel configured to couple with a front surface of the door frame, the cover bezel sized to overlay the front surface of the door frame and the coupling end of the mounting bezel.

\* \* \* \* \*